(12) United States Patent  (10) Patent No.: US 8,125,742 B2
Gurney et al.  (45) Date of Patent: Feb. 28, 2012

(54) FABRICATION OF MESOSCOPIC LORENTZ MAGNETORESISTIVE STRUCTURES

(75) Inventors: Bruce Alvin Gurney, San Rafael, CA (US); Ernesto E. Marinero, Saratoga, CA (US); Andrew Stuart Troup, Cambridge (GB); David Arfon Williams, Cambridge (GB); Joerg Wunderlich, Cambridge (GB)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 1195 days.

(21) Appl. No.: 11/857,393

(22) Filed: Sep. 18, 2007

(65) Prior Publication Data

US 2009/0073615 A1   Mar. 19, 2009

(51) Int. Cl.
*G11B 5/37*  (2006.01)
(52) U.S. Cl. ..................................... 360/313
(58) Field of Classification Search .................. None
See application file for complete search history.

(56) References Cited

U.S. PATENT DOCUMENTS

| | | | | |
|---|---|---|---|---|
| 3,987,485 A * | 10/1976 | Sugaya et al. | ............. | 360/63 |
| 4,568,906 A | 2/1986 | De Wilde et al. | ............. | 338/32 |
| 5,736,921 A | 4/1998 | Maeda et al. | ............. | 338/32 |
| 5,767,673 A | 6/1998 | Batlogg et al. | ............. | 324/252 |
| 5,936,402 A | 8/1999 | Schep et al. | ............. | 324/252 |
| 5,959,811 A | 9/1999 | Richardson | ............. | 360/113 |
| 6,765,767 B2 | 7/2004 | Trindade et al. | ............. | 360/319 |
| 6,914,761 B2 | 7/2005 | Gambino et al. | ............. | 360/326 |
| 7,016,161 B2 | 3/2006 | Hayakawa | ............. | 360/322 |
| 7,440,227 B2 * | 10/2008 | Chattopadhyay et al. | ..... | 360/112 |
| 2004/0218309 A1 * | 11/2004 | Seigler | ............. | 360/313 |
| 2005/0018345 A1 * | 1/2005 | Gerber | ............. | 360/112 |
| 2006/0018054 A1 | 1/2006 | Chattapadhyay et al. | ..... | 360/313 |
| 2006/0022672 A1 | 2/2006 | Chatapadhyay et al. | ...... | 324/252 |
| 2006/0023369 A1 | 2/2006 | Carey et al. | ............. | 360/324 |
| 2006/0193080 A1 * | 8/2006 | Chattopadhyay et al. | .... | 360/112 |

FOREIGN PATENT DOCUMENTS

JP   920235   8/1997

OTHER PUBLICATIONS

Holz et al., "Enhanced sensitivity due to current redistribution in the Hall effect of semiconductor-metal hybrid structures" Applied Physics Letters 86, 2005.
Solin et al., "Nanoscopic magnetic field sensor based on extraordinary magnetoresistance" J. Va. Sci. Technol. B 21(6), Nov./Dec. 2003.

(Continued)

*Primary Examiner* — Mark Blouin
(74) *Attorney, Agent, or Firm* — Zilka-Kotab, PC

(57) ABSTRACT

A Lorentz Magnetoresistive sensor having an extremely small lead width and lead spacing is disclosed. The sensor can be constructed by a novel fabrication method that allows the leads to be deposited in such a manner that lead width and spacing between the leads is determined by the as deposited thicknesses of the lead layers and electrically insulating spacer layers between the leads rather than by photolithography. Because the lead thicknesses and lead spacings are not defined photolithograhically, the lead thickness and lead spacing are not limited by photolithographic resolution limits.

15 Claims, 28 Drawing Sheets

OTHER PUBLICATIONS

Holz et al., "Semiconductor-Metal Hybrid Structures: Novel Perspective for Read Heads" Proceedings of IEEE, Sensors 2003, Part vol. 2. p. 1245-8 vol. 2.

Solin et al., "Room Temperature Exxtraordinary Magnetoresistance of Nonmagnetic Narrow-Gap Semiconductor/Metal Composites: Application to Read-Head Sensors for Ultrahigh-Density Magnetic Recording" IEEE Transactions on Magnetics, vol. 38, No. 1, Jan. 2002.

Sugiyama et al., "Highly Sensitive Split-Contact Magnetoresistor with AlAs/GaAs Superlattice Structures" IEEE Transactions on Electron Devices, vol. 36, No. 9, Sep. 1989.

Hoener et al., "Geometry-enhanced magnetoresistance of narrow Au/InAs hybrid structures incorporating a two-dimensional electron system" Journal of Applied Physics 99, 2006.

* cited by examiner

FABRICATION OF MESOSCOPIC LORENTZ MAGNETORESISTIVE STRUCTURES

FIELD OF THE INVENTION

The present invention relates generally to magnetoresitive sensors that employ the Lorentz force, and which therefore can exhibit the Corbino Effect, the Hall Effect or a combination of the two (collectively called Lorentz Magnetoresistors), and more particularly to an extraordinary magneto resistance (EMR) sensor design for increasing die data storage density and data rate of a magnetic recording system.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is oriented generally perpendicular to the air bearing surface (ABS) and the magnetic moment of the free layer is oriented generally parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \Theta$, where $\Theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

The drive for ever increasing data rate and data capacity has, however, led researchers to search for new types of magnetoresistive sensors, capable of increased sensitivity at decreased track widths. An important class of potential magnetoresistive sensors, magnetic recording sensors and scanning sensors, called Lorentz Magnetoresistors, rely on the Lorentz force resulting from the motion of a charged carrier in a magnetic field. One type of such devices is called a Hall sensor. Another is what has been called an Extraordinary Magnetoresistive Sensor (EMR). An advantage of these sensors is that the active region of the sensor is constructed of non-magnetic semiconductor materials, and does not suffer from the problem of magnetic noise that exists in giant magnetoresistive sensors (GMR) and tunnel valves, both of which use magnetic films in their active regions.

The EMR sensor includes a pair of voltage leads and a pair of current leads in contact with one side of the active region and an electrically conductive shunt in contact with the other side of the active region. In the absence of an applied magnetic field, sense current through the current leads passes into the semiconductor active region and is shunted through the shunt. When an applied magnetic field is present, current is deflected from the shunt and passes primarily through the semiconductor active region. The change in electrical resistance due to the applied magnetic field is detected across the voltage leads. EMR is described by T. Zhou et al., "Extraordinary magnetoresistance in externally shunted van der Pauw plates", Appl. Phys. Lett., Vol. 78, No. 5, 29 Jan. 2001, pp. 667-669.

However, even with the advantages of such EMR devices, there is an ever pressing need for increasing the data rate and data density of magnetic information that can be stored and read from a device. As these EMR devices and other Lorentz magnetoresistors become ever smaller, the ability to create the necessary extremely small leads and extremely small lead spacing is limited by the resolution limits of current photolithographic techniques.

Therefore, there is a strong felt need for a sensor design and method of fabrication that can allow such a sensor to be constructed at very small sizes beyond the resolution limits of currently available photolithographic processes. Such a structure and/or method would preferably allow the leads of such devices to be constructed at extremely small lead spacing so to allow very short magnetic bits to be read.

SUMMARY OF THE INVENTION

The present invention provides a Lorentz Magnetoresistive (LMR) sensor (also known to those skilled in the art as an extraordinary magnetoresistive sensor or (EMR)) having an extremely small lead width and lead spacing. The sensor can be constructed by a novel manufacturing method that allows the leads to be deposited in such a manner that lead width and spacing between the leads is determined by the as deposited thicknesses of the lead layers and electrically insulating spacer layers between the leads rather than being defined photolithographically. Because the lead thicknesses and lead spacings are not defined photolithograhically, the lead thickness and lead spacing are not limited by photolithographic resolution limits.

Therefore, the leads can be formed as layers deposited in a direction perpendicular to the direction of the magnetic field to be sensed (e.g. parallel to the ABS plane), resulting in lead layers that are formed along a plane that is perpendicular to the ABS. Similarly, the electrically insulating spacer layers between the leads can also be formed as layers deposited in a plane perpendicular to the direction of the magnetic field to be sensed resulting in insulating layers that are formed along a plane that is also perpendicular to the ABS plane.

In one possible embodiment of the invention, the magnetically active portion of the sensor can be constructed as a layer of semiconductor such as Si. This embodiment of the invention facilitates the deposition of the magnetically active portion of the EMR sensor in a direction parallel to the ABS, thereby facilitating the deposition of the leads and spacer layer in this same direction as well.

In one possible method of manufacturing a sensor according to an embodiment of the invention, a trench can be formed in a non-magnetic, electrically insulating substrate material. A series of lead and spacer layers can then be deposited into the trench. Then, a portion of those lead and spacer layers can be removed and a material such as a semiconductor can be deposited to form a magnetically active structure adjacent to the lead and spacer layers. Another material removal and refill process can be performed to form a shunt structure adjacent to the magnetically active structure opposite the lead and spacers.

In another possible embodiment of the invention, the leads and magnetically active portion can be formed by a successive series of fill and etching steps, so that a portion of the magnetically active structure is deposited after the deposition of each of one or more lead and insulation layers.

In a third possible embodiment of the invention, the leads and insulating layers are first deposited onto the substrate. This is followed by an etching process to remove a portion of the lead and spacer layers and a material such as a semiconductor can be deposited to form a magnetically active structure adjacent to the lead and spacer layers. Another material removal and refill process can then be performed to form a shunt structure adjacent to the magnetically active structure opposite the lead and spacers.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
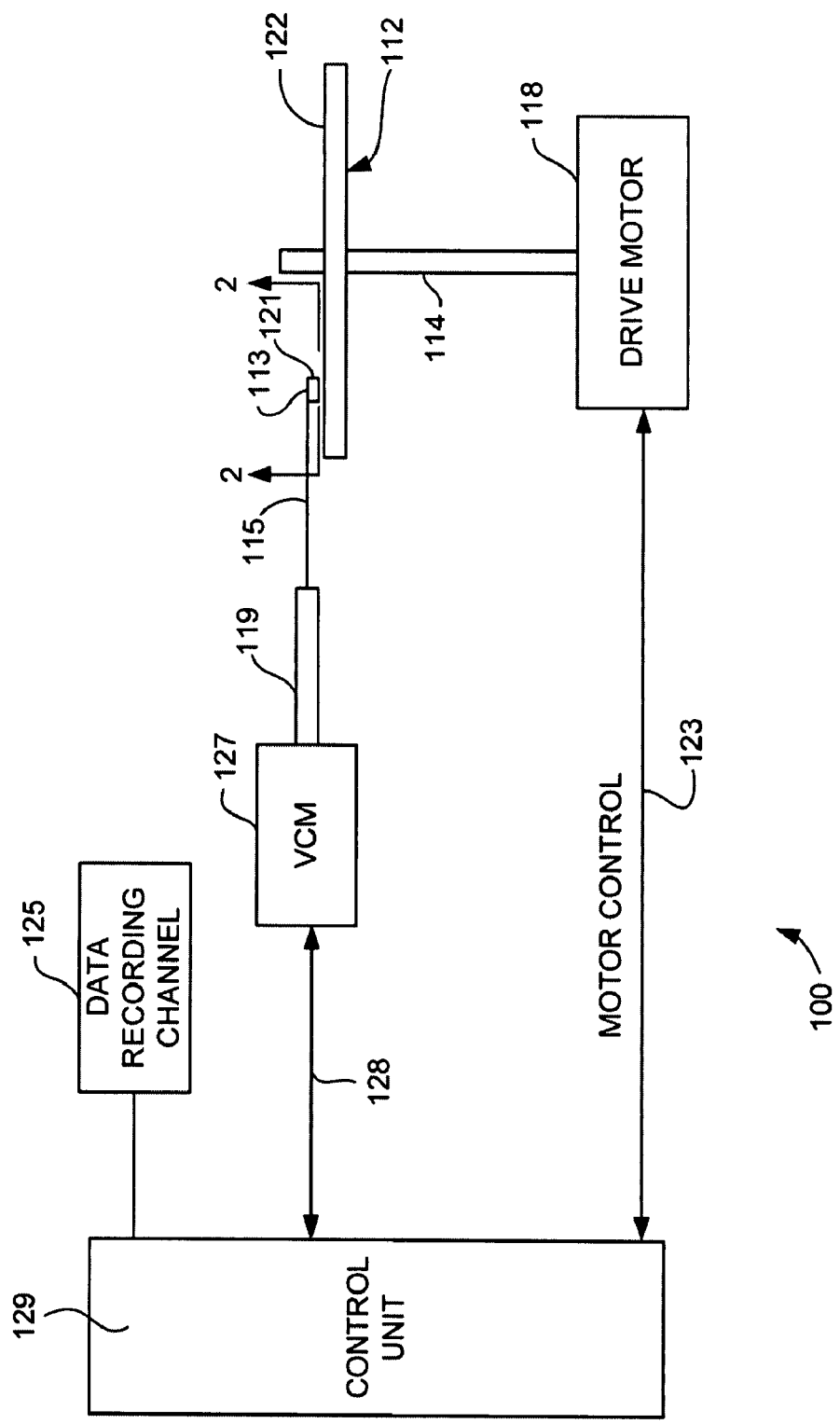
FIG. 1 is a schematic illustration of a disk drive system in which the invention might be embodied.

Referring now to FIG. 1, there is shown a disk drive 100 which could embody this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by control unit 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
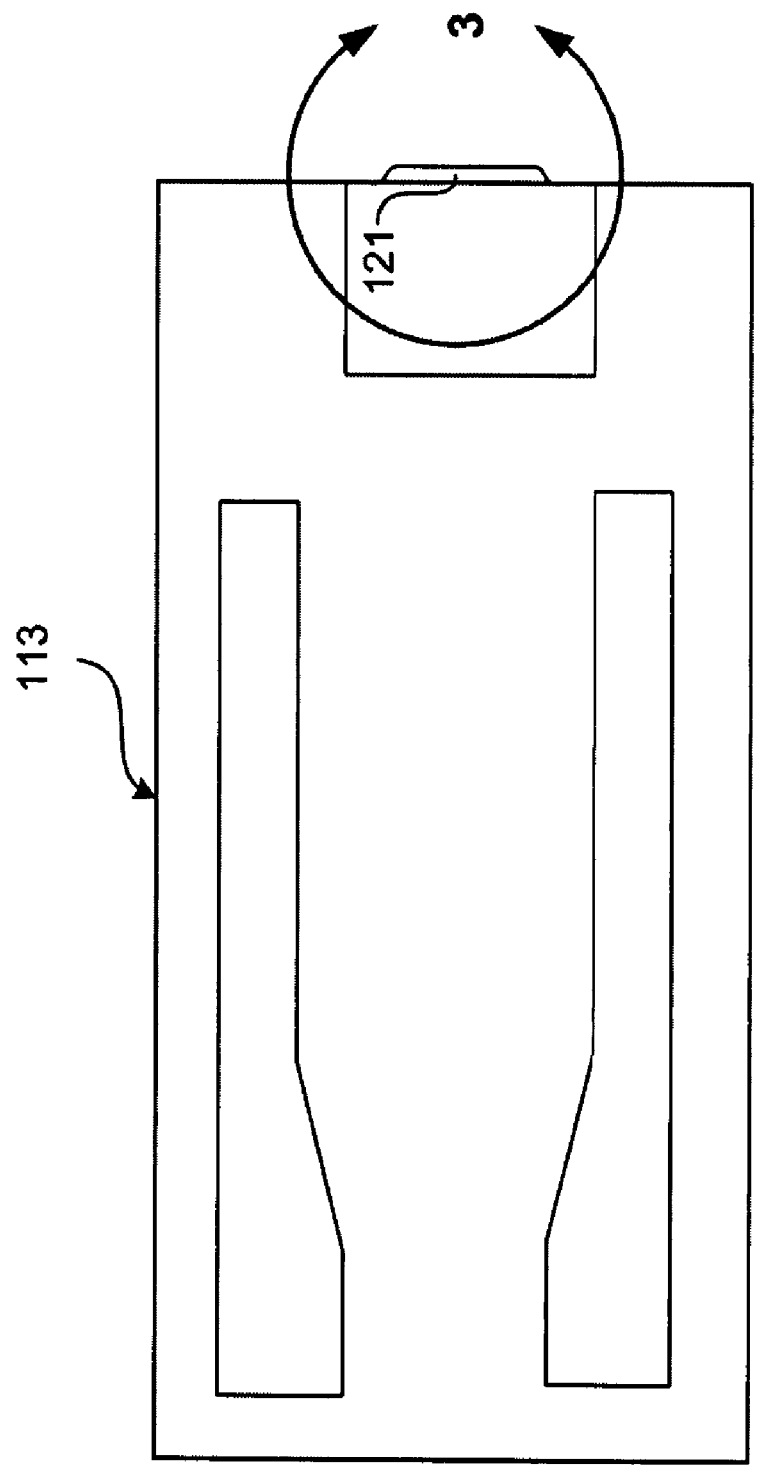
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
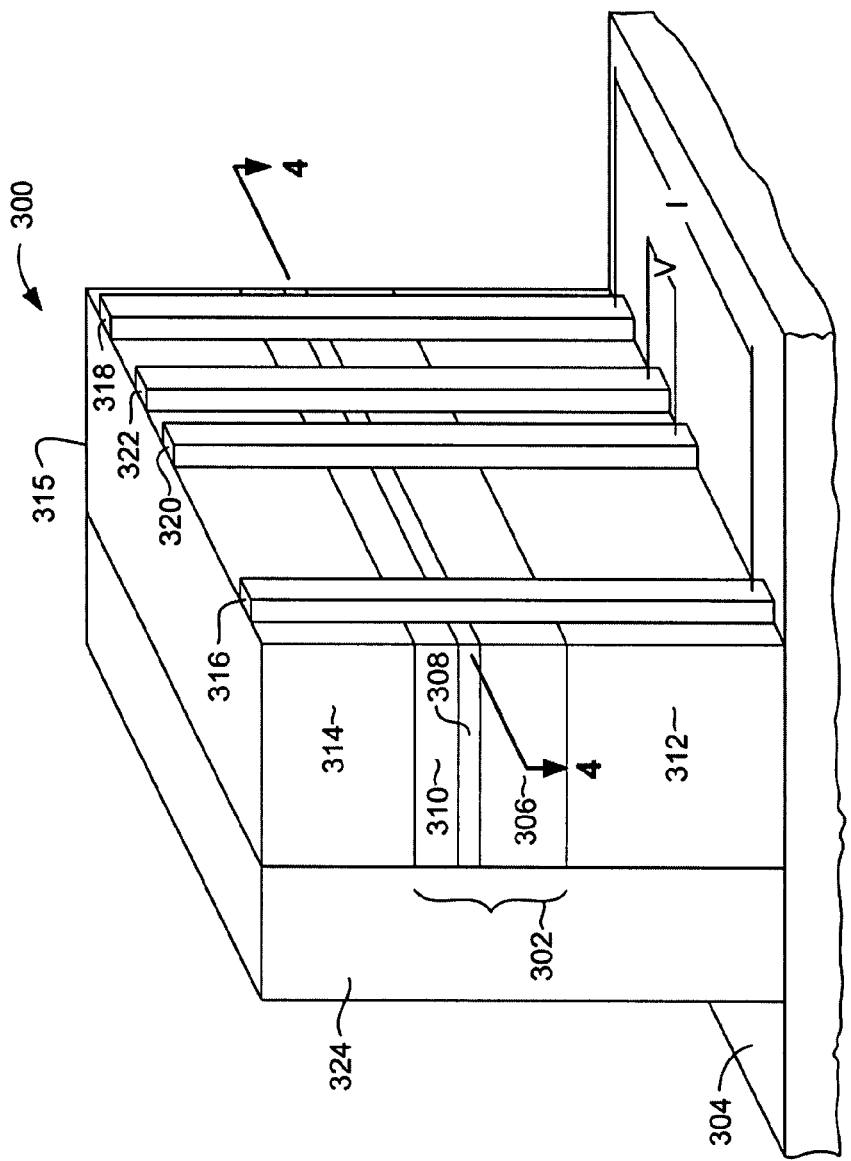
FIG. 3 is schematic, isometric view of an EMR device according to the prior art.

With reference now to FIG. 3, a prior art extraordinary magnetoresistive sensor (EMR) 300 for use in a magnetic head 121 (FIG. 2) is shown. The EMR sensor 300 may include a structure 302 that is a III-V heterostructure formed on a semiconductor substrate 304 such as GaAs. However, the EMR sensor described in this invention is not restricted to III-V semiconductor materials. For example, it may also be formed on the basis of silicon, or germanium. In addition, the invention is not restricted to III-V heterostructures, it may also be formed of III-V semiconductor thin films. The heterostructure 302 includes a first layer 306 of semi-conducting material having a first band-gap, a second layer 308 of semi-conducting material formed on the first layer 306 and having a second bandgap that is smaller than that of the first layer 306, and a third semi-conducting layer 310 of semi-conducting material formed on top of the second layer 308 and having a third band gap that is greater than the second band gap. The materials in the first and third layers 306, 310 may be similar or identical. An energetic potential well (quantum well) is created by the first, second and third semi-conducting material layers due to the different band-gaps of the different materials. Thus, carriers can be confined inside layer 308, which is considered the EMR active film in the sensor 300. This is also referred to as the quantum well or a two-dimensional electron gas (2DEG) layer.

The first layer 306 is typically formed on top of a buffer layer 312 that may be one or more layers. The buffer layer 312 comprises several periods of a superlattice structure that functions to prevent impurities present in the substrate from migrating into the functional layers 306, 308, 310. In addition, the buffer layer 312 is chosen to accommodate the typically different lattice constants of the substrate 304 and the functional layers of the heterostructure 302 to thus act as a strain relief layer between the substrate and the functional layers.

One or more doped layers are incorporated into the semiconducting material in the first layer 306, the third layer 310, or both layers 306 and 310, and spaced apart from the boundary of the second and third semiconducting materials. The doped layers provide electrons (if n-doped) or holes (if p-doped) to the quantum well. The electrons or holes are concentrated in the quantum well in the form of a two dimensional electron-gas or hole-gas, respectively. Doping layers are not necessary in the case of AlSb/InAs/AlSb heterostructures wherein the electrons originate from deep donors in the AlSb layers as well as from states at the interface between the AlSb and the InAs quantum well.

The layers 306, 308, 310 may be a $Al_{0.09}In_{0.91}Sb/InSb/Al_{0.09}In_{0.91}Sb$ heterostructure grown onto a semi-insulating GaAs substrate 304 with a buffer layer 312 in between. The layers 306, 308, 310 may also be AlSb/InAs/AlSb. InSb, GaAs and InAs are narrow band-gap semiconductors. Narrow band-gap semiconductors typically have a high electron mobility, since the effective electron mass is greatly reduced. For example, the room temperature electron mobility of InSb and InAs are 70,000 $cm^2$/Vs and 35,000 $cm^2$/Vs, respectively.

The bottom $Al_{0.09}In_{0.91}Sb$ layer 306 formed on the buffer layer 312 has a thickness in the range of approximately 1-3 microns and the top $Al_{0.09}In_{0.91}Sb$ layer 310 has a thickness in the range of approximately 10 to 1000 nm, typically 50 nm. The doping layers incorporated into layers 306, 310 have a thickness from one monolayer (delta-doped layer) up to 10 nm. The doping layer is spaced from the $InSb/Al_{0.09}In_{0.91}Sb$ boundaries of first and second or second and third semiconducting materials by a distance of 10-300 Angstrom. n-doping is preferred, since electrons typically have higher mobility than holes. The typical n-dopant is silicon with a concentration in the range of 1 to $10^{19}/cm^3$. In the case of AlSb/InAs/AlSb quantum wells, delta doping is also possible to increment the electron density in the InAs quantum well. This is typically done by intercalating a few monolayers of Te within the AlSb layers. The deposition process for the heterostructure 302 is preferably molecular-beam-epitaxy, but other epitaxial growth methods can be used.

A capping layer 314 is formed over the heterostructure 302 to protect the device from corrosion. The capping layer 314 is formed of an insulating material such as oxides or nitrides of aluminum or silicon (e.g., $Al_2O_3, Si_3N_4$,) or a non-corrosive semi-insulating semiconductor. The layers 312, 306, 308, 310, 314 together form a structure that can be referred to as a mesa structure 315.

Two current leads 316, 318 and two voltage leads 320, 322 are patterned over one side of the EMR structure 302 so that they make electrical contact with the quantum well. A metallic shunt 324 is patterned on the side opposite the current and voltage leads of the EMR structure 302 so that it makes electrical contact with the quantum well. An applied magnetic field H (FIG. 4), i.e., the magnetic field to be sensed, is generally oriented normal to the plane of the layers in the EMR structure 302. The leads typically comprise metallic contacts, for example Au, AuGe, or Ge diffused into the device. For the case of an EMR device based on Si, the leads and shunt material are preferably a metallic alloy of Si, such as $TiSi_2$ or regions of highly n-type doping. The leads are typically formed after deposition of the capping layer 314, and sometimes after removal of some of the capping layer material.

Figure 4:
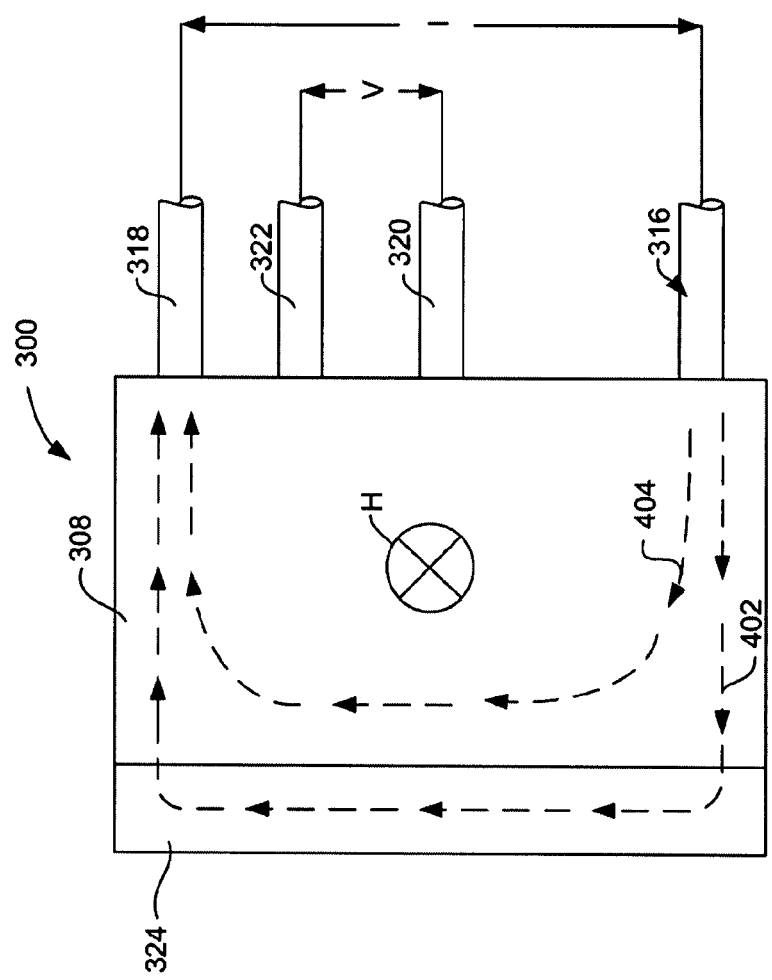
FIG. 4 is a cross sectional view taken from line 4-4 of FIG. 3.

FIG. 4 is a top schematic view of the EMR sensor 300 through a section of the active film 308 and will illustrate the basic operation of the sensor. In the absence of an applied magnetic field H, sense current through the leads 316, 318 passes into the semiconductor active film 308 and is shunted through the shunt 324, as shown by line 402. When an applied magnetic field H, having a component perpendicular to the plane of the layers in the EMR structure 302, is present, as shown by the arrow tail into the paper in FIG. 4, current is deflected from the shunt 324 and passes primarily through the semiconductor active film 308, as shown by line 404. The change in electrical resistance due to the applied magnetic field is detected across the voltage leads 320, 322.

Figure 5:
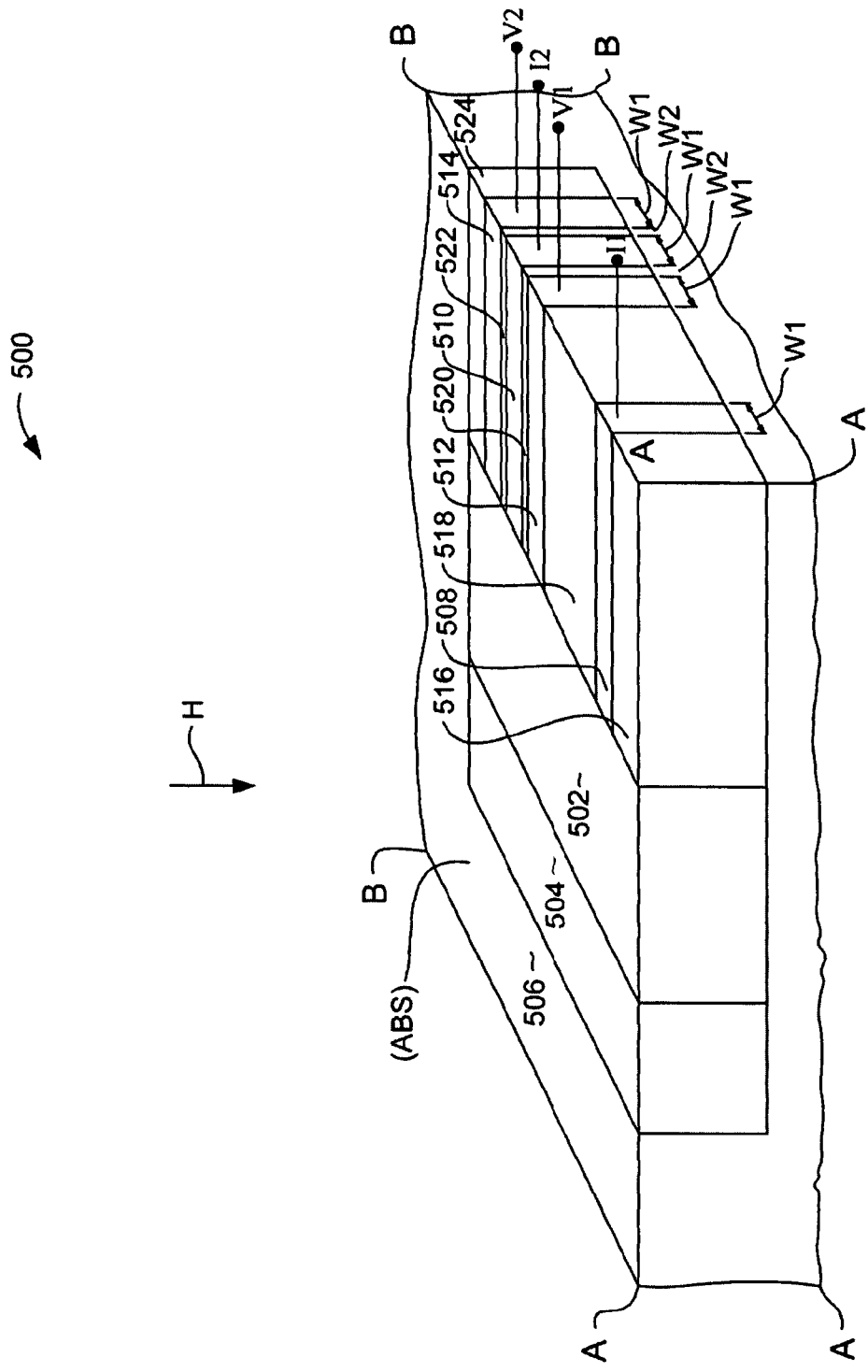
FIG. 5 is a schematic, isometric view of an EMR device according to an embodiment of the invention.

With reference now to FIG. 5 an EMR sensor 500 according to an embodiment of the invention is shown. FIG. 5 is a cut away, perspective view of the EMR sensor 500 with the air bearing surface (ABS) at the top surface of the structure as shown. The sensor 500 can be better understood by defining planes AAAA and BBBB. Plane AAAA is shown in the foreground in FIG. 5 and is denoted by the corners indicated by letters "A". Plane BBBB letters "B" only three of which are shown in FIG. 5. The planes AAAA and BBBB are both parallel with one another, and are perpendicular to the air bearing surface ABS.

The EMR sensor 500 can include magnetically active layer 502, which is preferably constructed of a semiconductor material such as Si. The EMR sensor also includes an electrically conductive shunt structure 504, which can be constructed of a material such as $TiSi_2$ or some other non-magnetic, electrically conductive material. The EMR sensor 500 is embedded in a non-magnetic substrate material 506, such as an oxide or nitride layer.

Whereas prior art EMR sensors have used semiconductor multilayer structures such as that described above with reference to FIG. 3 in order to form a quantum well, the present invention can be implemented using a magnetically active region 502 that is formed as a layer of a semiconductor material such as Si, without the need for a multilayer structure such as that described above. Other suitable semiconductor materials are thin films of the III-V group such as GaAs, InSb and InAs. It should be pointed out that the invention can be practiced with an EMR heterostructure such as that described above with reference to FIG. 3. However, the EMR structure described with reference to FIG. 5, facilitates fabrication of the novel lead structure to be described below, and also provides certain performance advantages when used in a sensor having very small spatial resolution.

The sensor 500 includes first and second current leads 508, 510 and first and second voltage leads 512, 514. The sensor 500 functions similarly to the sensor 300 described above with reference to FIG. 3, in that, in the absence of a magnetic field, current flowing from the first current lead 508 to the second current lead 510 passes through the shunt 504. In the presence of a magnetic field oriented perpendicular to the ABS, more of the current is deflected into the semiconductor, magnetically active portion 502 of the sensor 500 which increases the electrical resistance measured across the voltage leads 512 and 514.

With continued reference to FIG. 5, the EMR sensor 500 includes a novel lead structure that allows the leads to be constructed with extremely narrow lead spacing, allowing the EMR sensor to read extremely small data bits. Prior art lead structures have been defined by photolithographically patterning the width of the leads as well as the spacing between the leads. Therefore, the lead spacing has been limited by the resolution limits of currently available photolithography. The ability to pattern very narrow lead spacing in this manner has been further limited by the tall topography of the EMR structure itself, which makes high resolution photolithography even more difficult.

The lead structure of the present invention is, however, fundamentally different, and allows the leads to be constructed with extremely narrow lead widths and lead spacing. As seen in FIG. 5 the leads 508, 510, 512, 514 are separated by electrically insulating spacer layers 516, 518, 520, 522, 524. The lead layers 508-514 and insulating spacers 516-524 are deposited in a plane that is perpendicular to the AAAA and BBBB planes and parallel with the ABS, resulting in lead layers 508, 510, 512, 514 that are formed along planes that are parallel with the AAAA and BBBB planes and perpendicular to the ABS. The deposition can be from the direction of either the AAAA plane or the BBBB plane. This is fundamentally different from prior art devices in which the leads have been deposited in a direction perpendicular to the ABS (parallel with AAAA and BBBB), and in which the lead widths and spacing are determined by photolithographic processes.

Therefore, with the present invention, the width W1 of each lead layer 508-514 and the width W2 of each spacer layer 516-524 in a direction perpendicular to the AAAA and BBBB planes are determined by the thicknesses of each of the layers 508-524. Because the thickness of each layer can be carefully controlled at very small sizes, this allows the widths of the leads and spacing between the leads to be extremely small. As shown in FIG. 5, the sensor 500 preferably has a IVIV lead configuration in that one of the current leads 510 is sandwiched between (and electrically insulated from) the two voltage leads 512, 514. This has been found to provide performance advantages over the IVVI structure described above with reference to FIG. 3. This IVIV structure also results in an even greater need for very small lead width and lead spacing, because of the additional voltage lead separation necessitated by the placement of the current lead 510 between the two voltage leads 512, 514.

As mentioned above, each of the lead layers 508-514 and spacer layers 516-524 can be described as being formed along a plane (or having a surface defining a plane) that is oriented parallel to the AAAA and BBBB planes of FIG. 5 and also preferably perpendicular to the ABS. The electrically conductive leads 508-514 can be constructed, for example, by first depositing polysilicon (which at a later stage is combined with Si to form $TiSi_2$), and each of the spacer layers can be constructed, for example, of an oxide or nitride. Each of the lead layers 508-514 can have a width W1 of 2-10 nm or about 5 nm. Each of the spacer layers 520-522 in the VIV region can have a width W2 of 1-5 nm or about 2 nm, the widths W1 and W2 being defined (as mentioned above) by the deposited thicknesses of the layers 508-514, 520 and 522.

Figure 6:
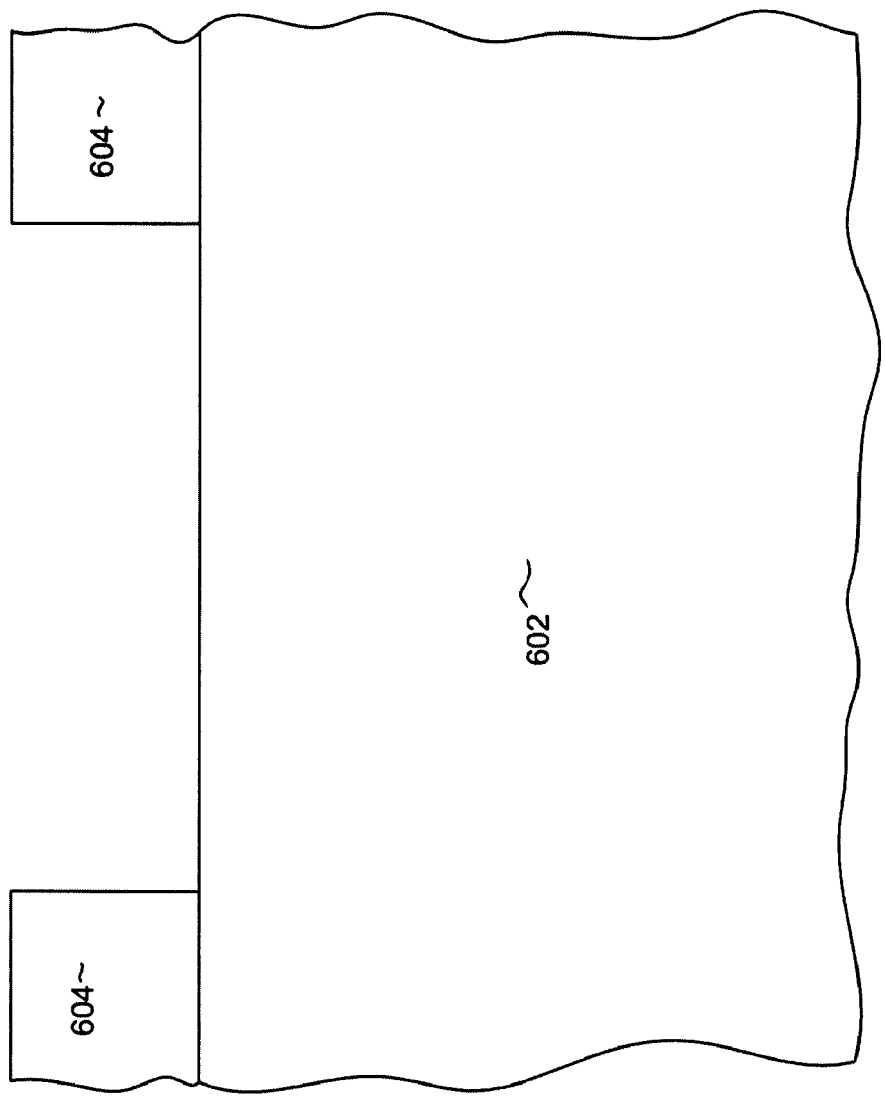
FIGS. 6-13 are cross sectional views illustrating a method of manufacturing an EMR sensor according to an embodiment of the invention.
Figure 7:
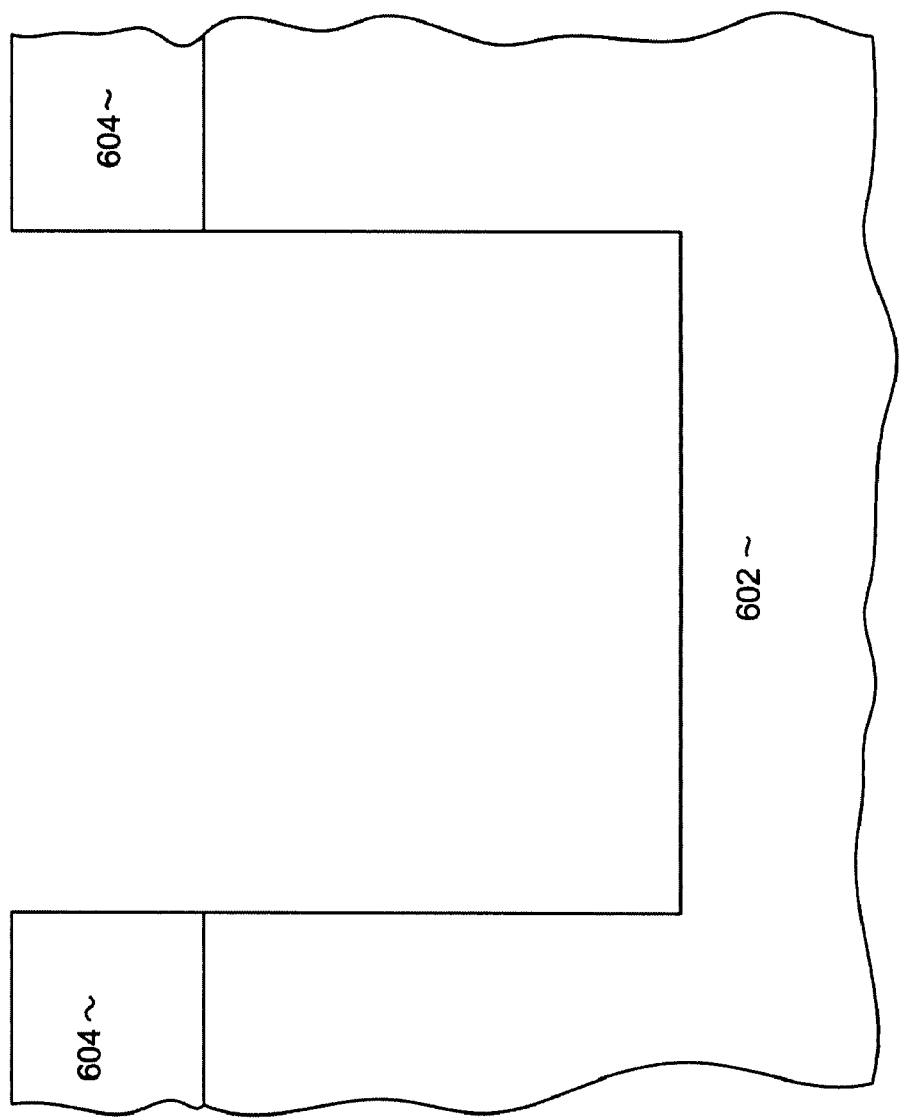

With reference now to FIGS. 6-13, a possible method is described for fabricating an EMR sensor (such as sensor 500 of FIG. 5) according to an embodiment of the invention. With particular reference to FIG. 6, a substrate 602 is provided. The substrate can be, for example Si, or some other semiconducting material. A mask 604 is formed over the substrate. The mask 604 can be constructed of a material such as photoresist and is formed with an opening that is configured to define a trench as will be seen. Then, with reference to FIG. 7, a material removal process such as reactive ion etching (RIE) or wet etching is performed to form a trench in the substrate 602.

Figure 8:
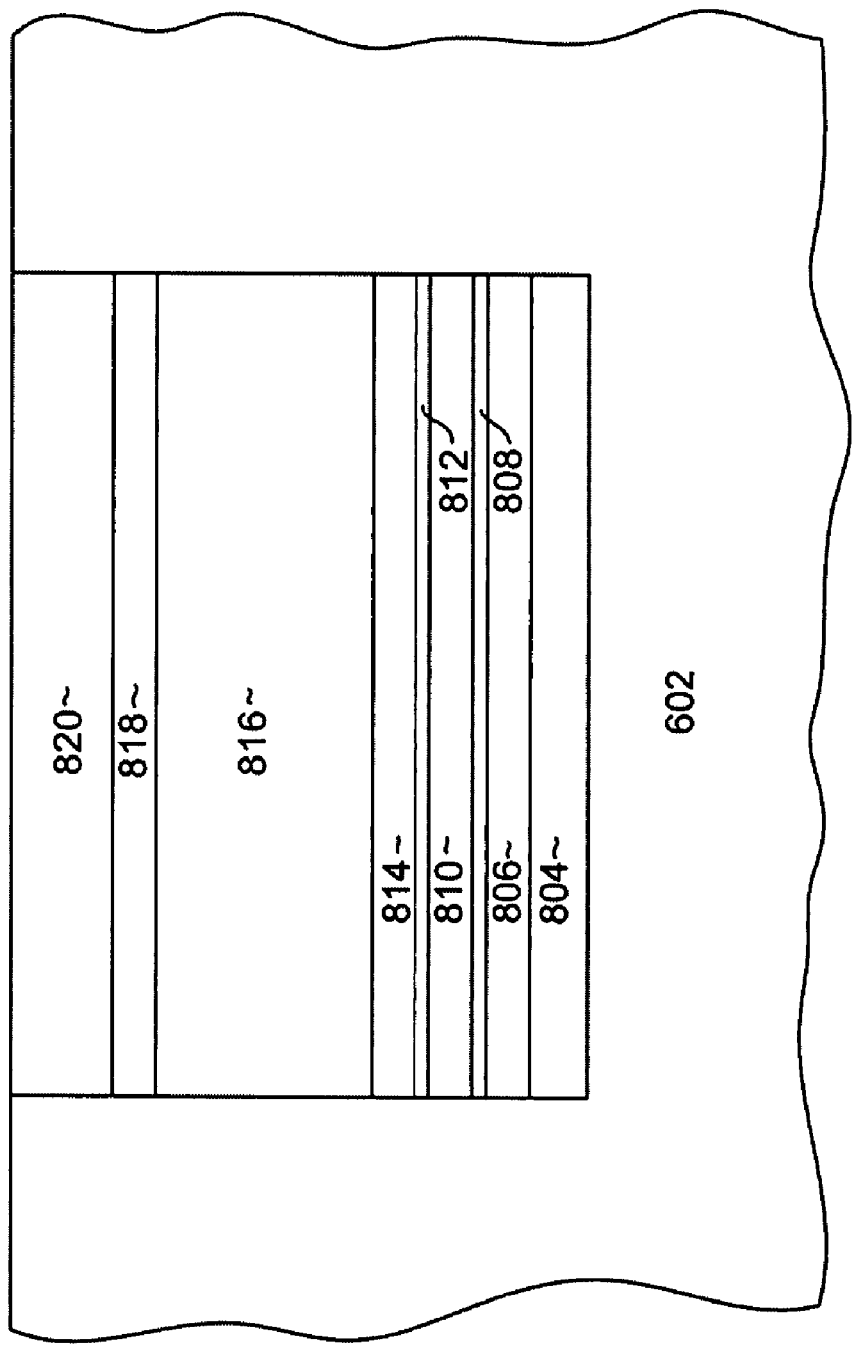

Then, with reference to FIG. 8, a series of lead and insulation layers are deposited into the trench formed in the substrate 602. First, an insulation layer 804 can be deposited. Then, a first lead layer 806 can be deposited, followed by an insulation layer 808. Then, a second lead layer 810 can be deposited, followed by an insulation layer 812. Then, a third lead 814 can be deposited followed by another, thicker insulation layer 816. Finally, a fourth lead 818 can be deposited, followed by an insulation layer 820.

Each of the lead layers 806, 810, 814 and 818 can be constructed of an electrically conductive material such as $TiSi_2$, or highly n-type doped polysilicon, and each of the electrically insulating layers 804, 808, 812, 816 and 820 can be constructed of an electrically insulating material such as an oxide or nitride. In the case of polysilicon, to render the lead layers 806, 810, 814 and 818 highly conducting, Ti is co-deposited with polysilicon and this is followed by an annealing step to form the desired $TiSi_2$ conducting lead. The layer 806 corresponds to the lead layer 514 in FIG. 5. Similarly, the layer 810 corresponds to lead 510, layer 814 corresponds to lead 512 and layer 818 corresponds to lead 508. Therefore, each of the layers 806, 810, 814, 818 can be deposited to a thickness of 2-10 nm or about 5 nm, thereby defining the lead width W1 discussed earlier with reference to FIG. 5.

The layer 804 corresponds to insulation layer 524 in FIG. 5. Similarly, the layer 808 corresponds to layer 522, layer 812 corresponds to layer 520, layer 816 corresponds to layer 518 and layer 818 corresponds to layer 508. Therefore, the layers 808 and 812 can each have a thickness of 1-5 nm or about 2 nm, thereby defining the width W2 discussed above with reference to FIG. 5.

Figure 9:
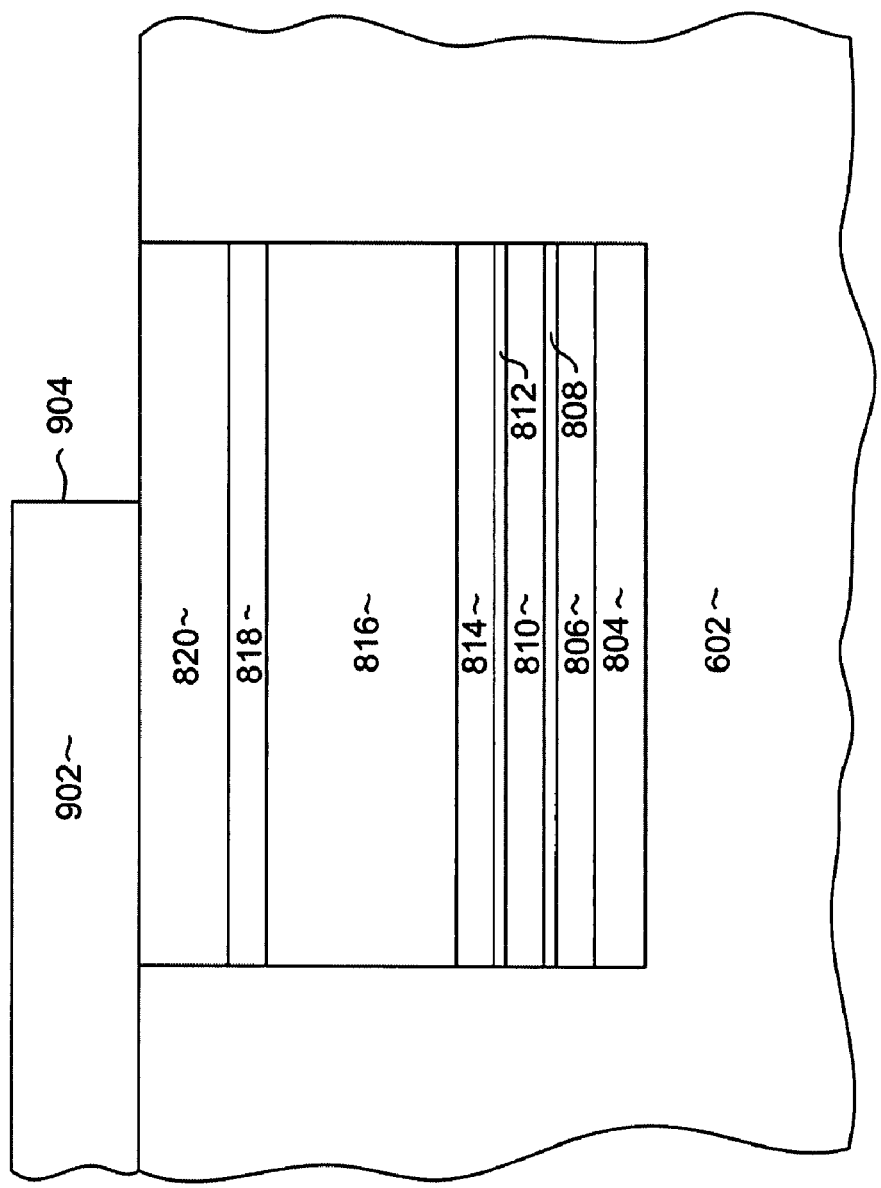
Figure 10:
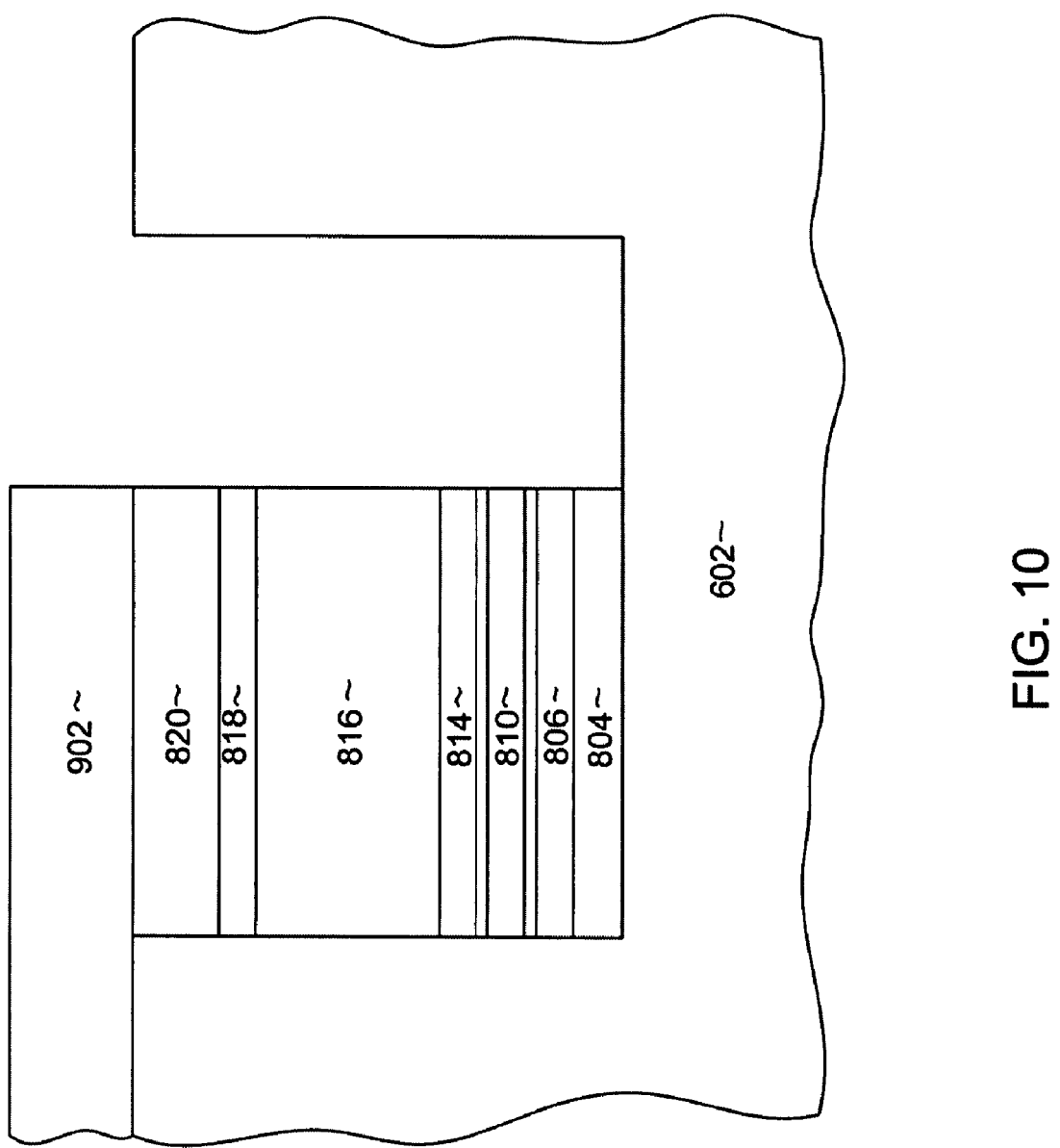
Figure 11:
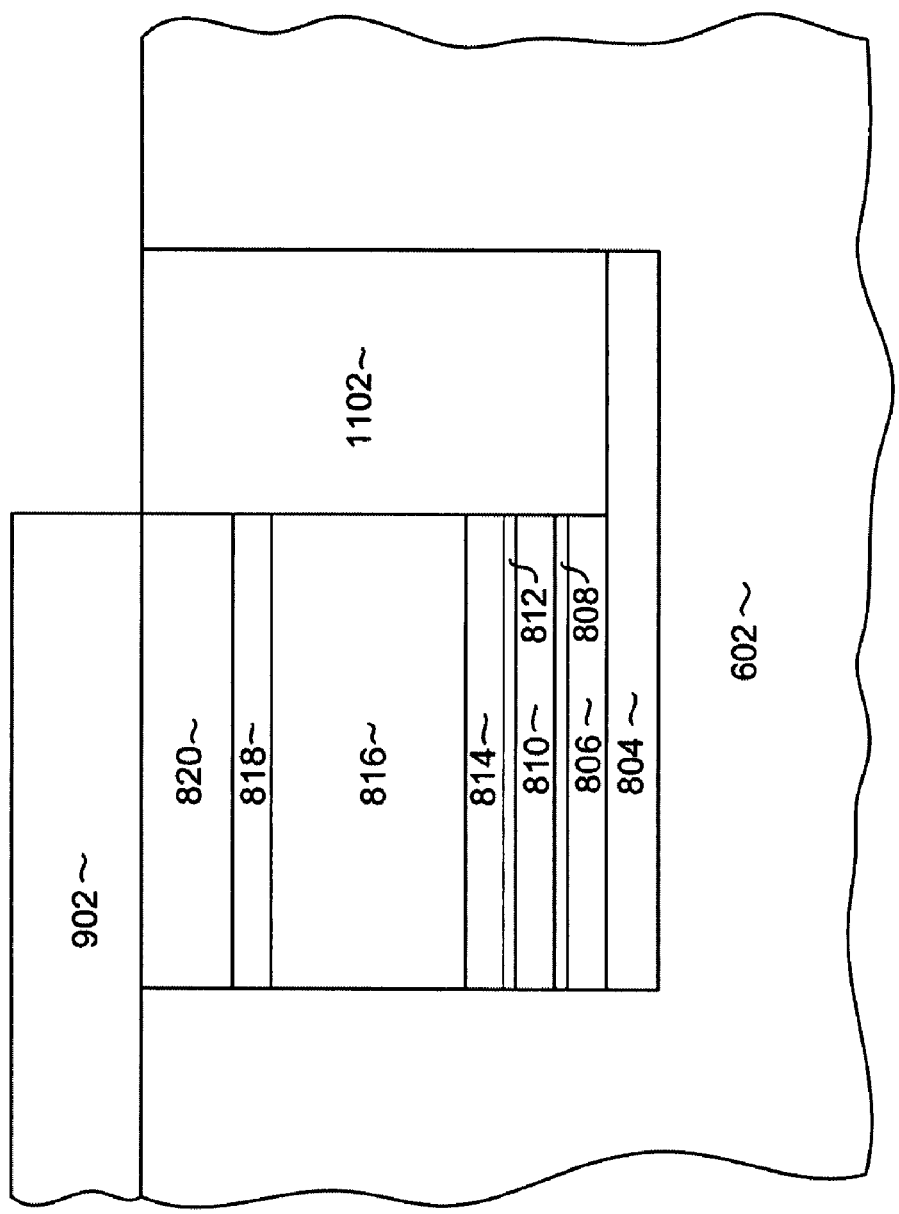

With reference now to FIG. 9, a mask 902 such as a photoresist mask is formed having an edge 904 and configured to leave a desired portion of the underlying layers 804-820 uncovered. Then, a material removal process such as etching is performed to remove portions of the layers 804-820 that are not covered by the mask 902. This forms a trench in the layers 804-820 as depicted in FIG. 10. Then, with reference to FIG. 11, a material such as silicon 1102 is deposited into the trench formed above. This silicon layer, then forms the magnetically active layer 502 discussed above with reference to FIG. 5.

Figure 12:
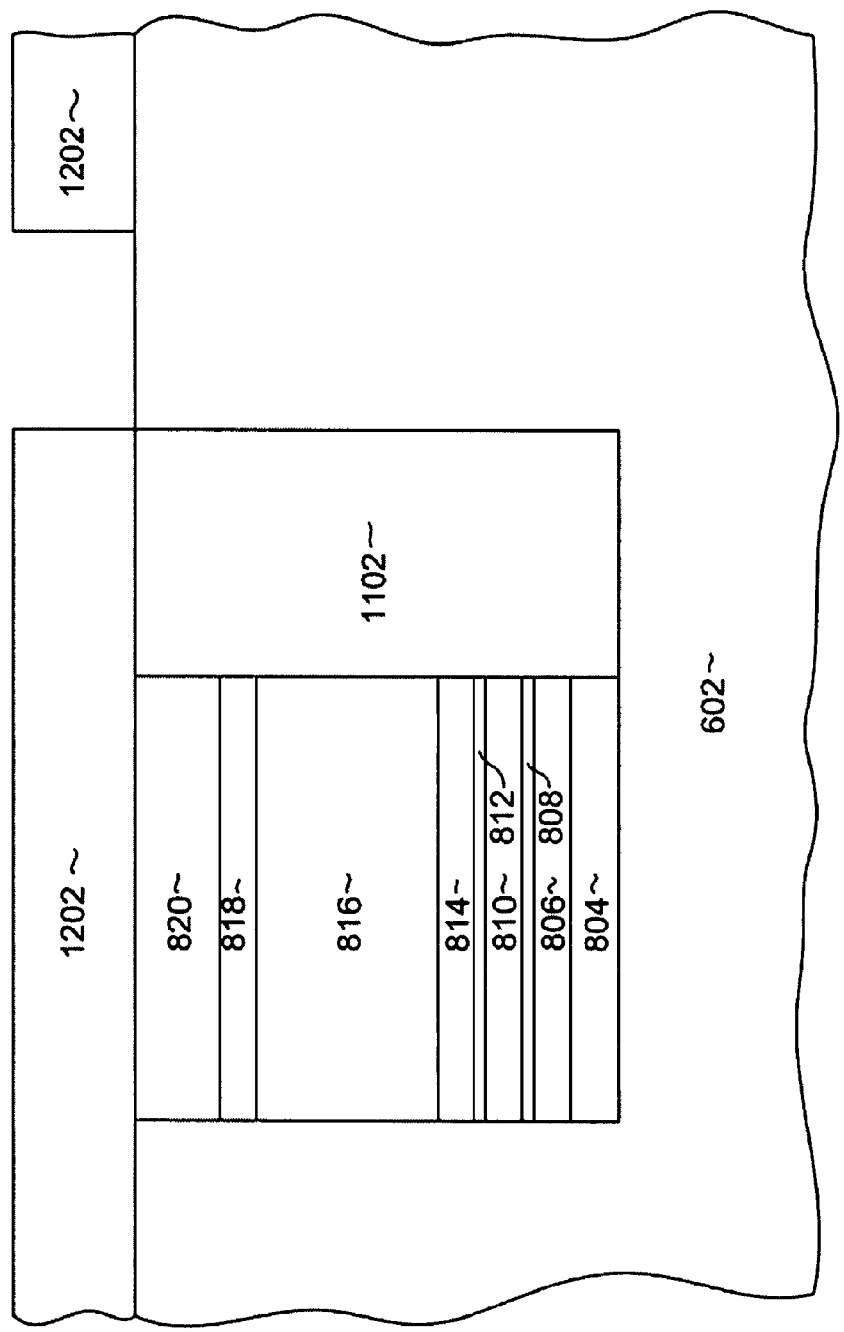
Figure 13:
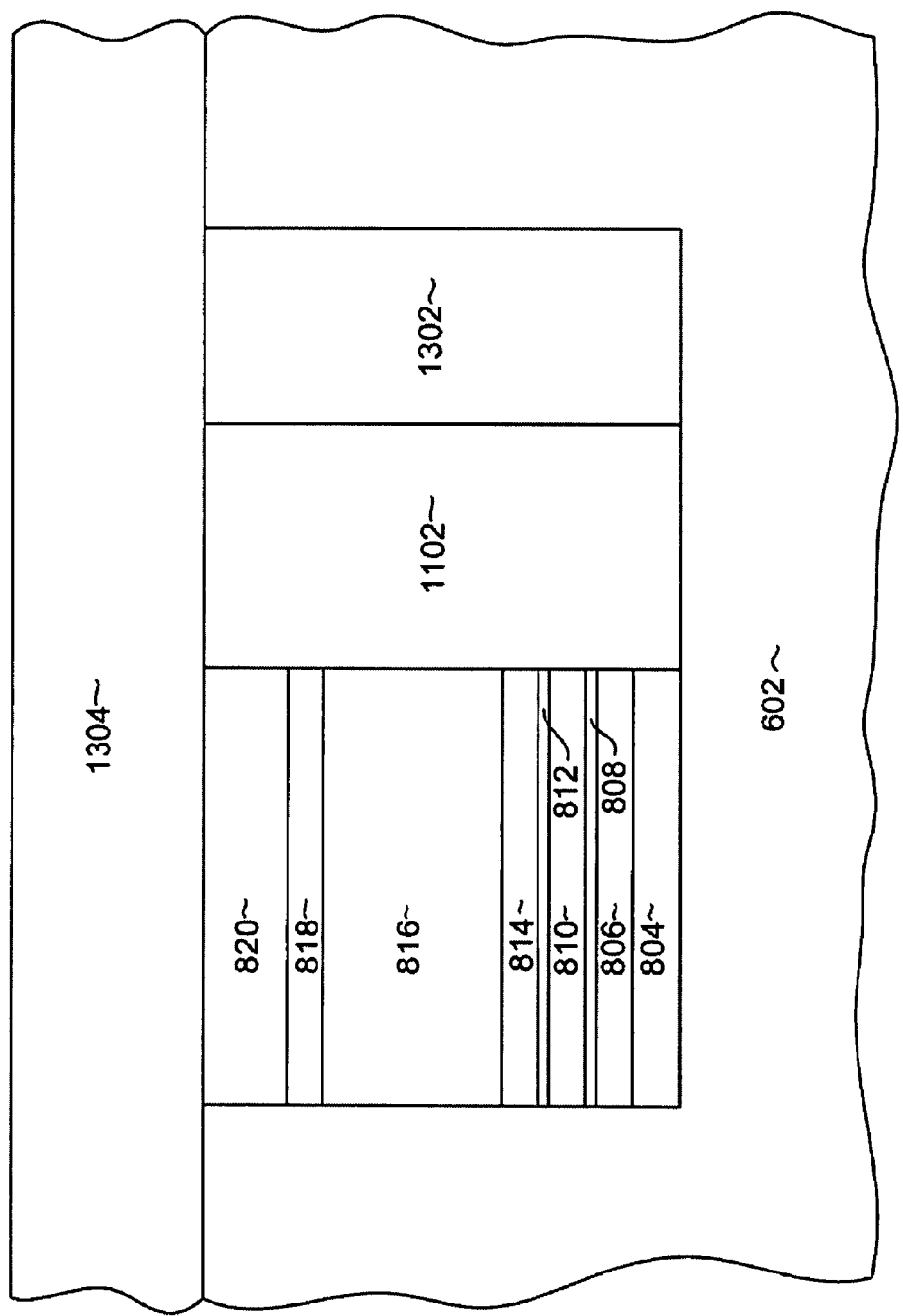

Then, with reference to FIG. 12, the mask 902 is removed and a new mask 1202 is formed of a material such as photoresist. The mask 1202 has an opening that is adjacent to an edge of the magnetically active layer 1102. As will be seen, the opening in the mask 1202 is configured to define the shunt 504 described earlier with reference to FIG. 5. Then, with reference to FIG. 13, another material removal process such as etching is performed to remove the portion of the substrate material 602 that is not protected by the mask 1202, thereby forming a trench in the substrate 602 adjacent to the magnetically active layer 1102, opposite the lead and insulation layers 804-820, and an electrically conductive material 1302, such as $TiSi_2$ or other conducting material is deposited into the trench.

A protective layer 1304 of a hard, non-magnetic, electrically insulating material such as alumina may be deposited over the top of all of the layers to protect the EMR sensor just formed from damage. In order to form an EMR sensor for use in a magnetic data recording device, the structure just formed will be sliced and lapped so that the structure as viewed in FIG. 13 will be exposed to form an air bearing surface (ABS) such as the ABS described above with reference to FIG. 5.

With reference now to FIGS. 14-28, another possible method is described for manufacturing an EMR sensor according to an embodiment of the invention. The method described with reference to FIGS. 14-28 utilizes series of multiple, gentler etching steps. Because the etching steps are gentler than with the previously described embodiment, they are less likely to cause damage to the layers of the sensor, as will be better understood upon reading the following description.

Figure 14:
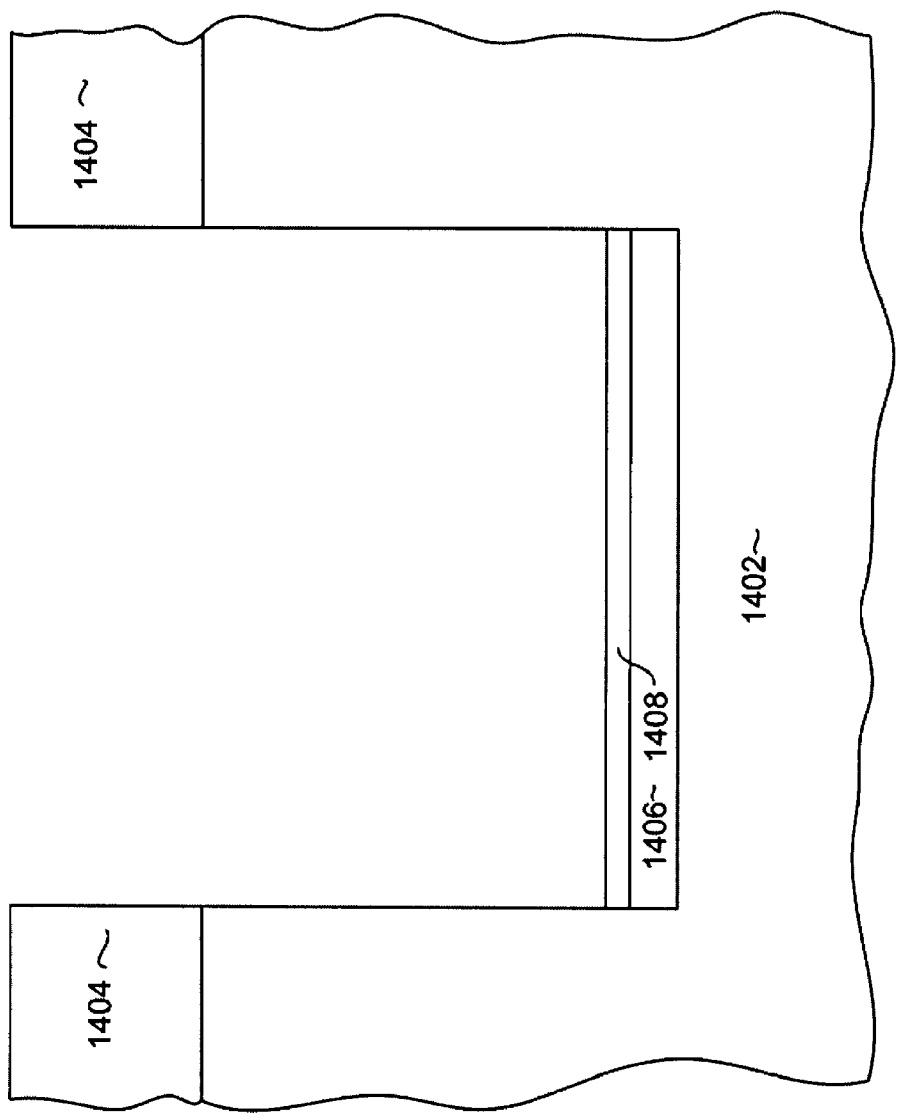
FIGS. 14-28 are cross sectional views illustrating a method of manufacturing an EMR sensor according to an embodiment of the invention.
Figure 15:
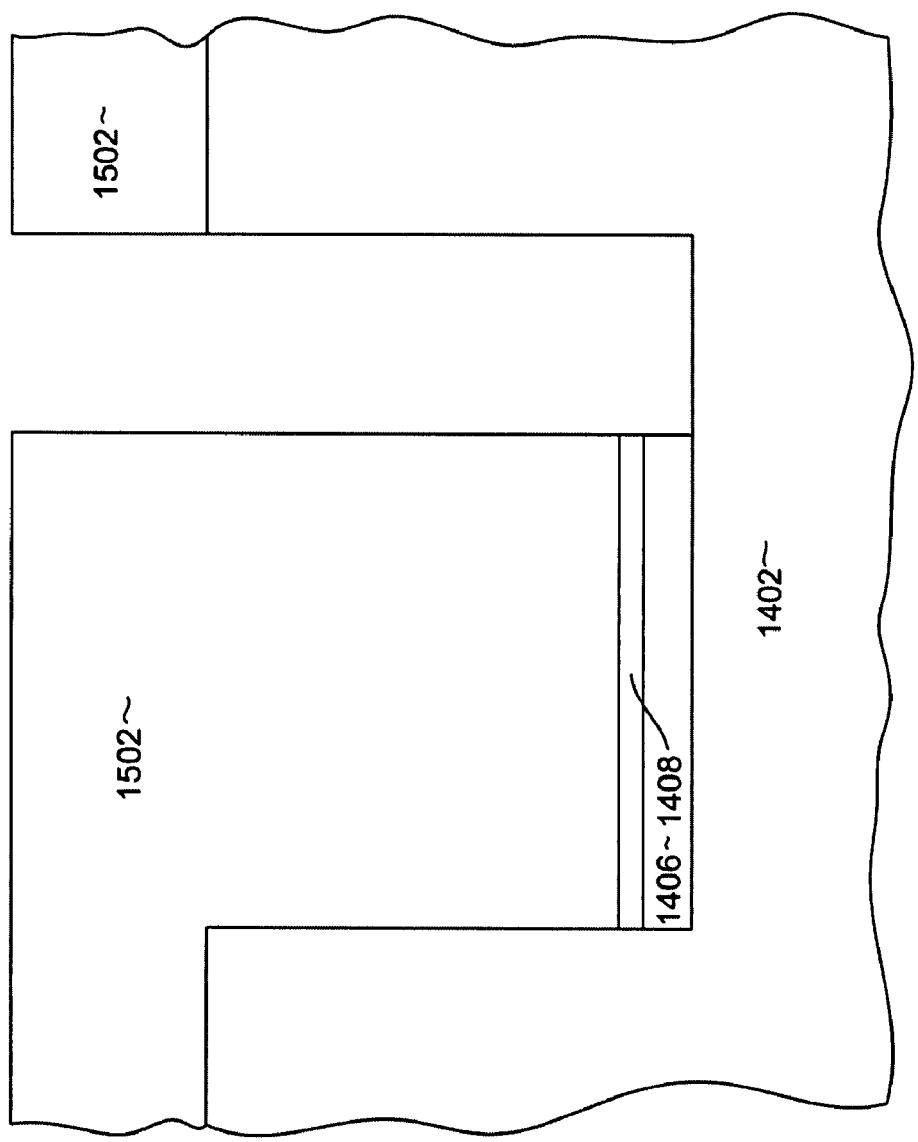
Figure 16:
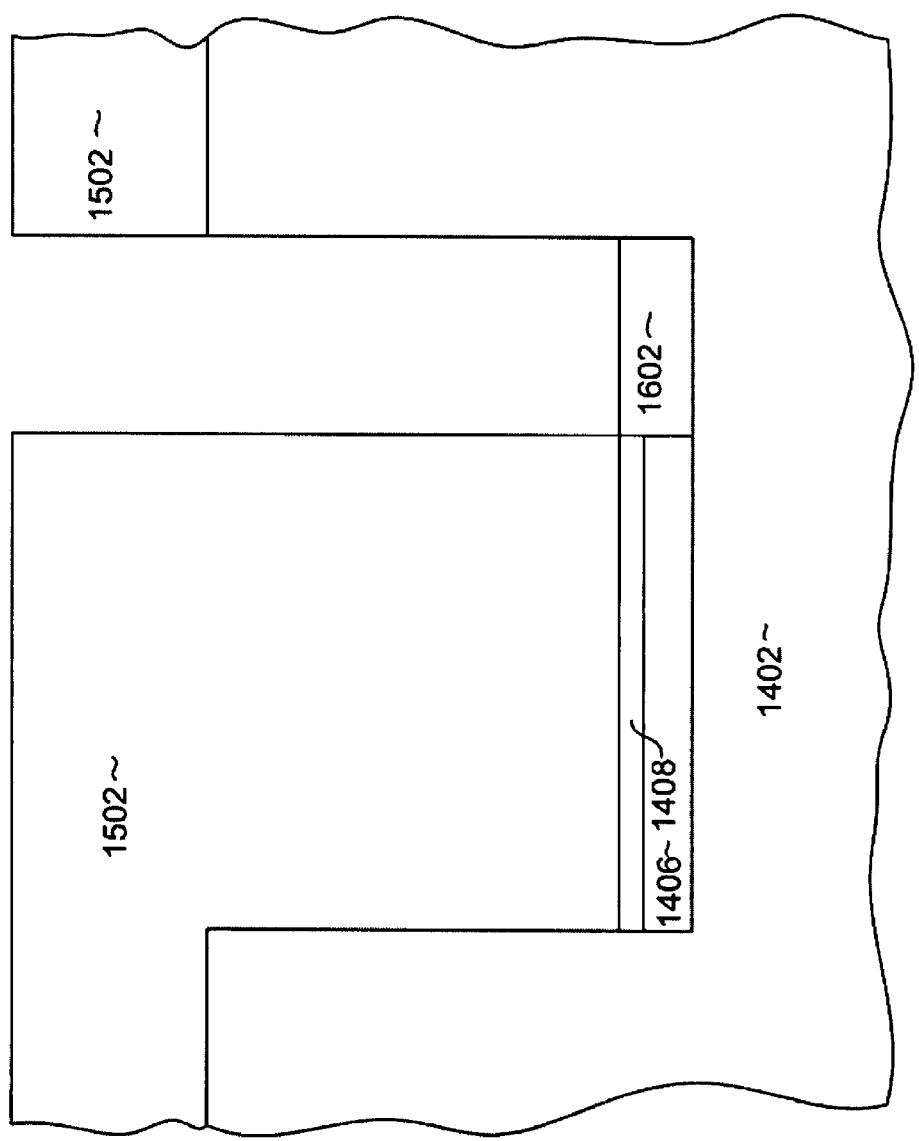

With particular reference to FIG. 14, a substrate 1402 is provided. The substrate 1402 can be constructed of, for example, Si, GaAs, InSb, or InAs. A mask 1404 is formed over the substrate 1402, the mask having an opening to define a trench into which an EMR sensor will be formed. A material removal process such as etching is performed to remove a portion of the substrate 1402 that is not protected by the mask 1404, thereby forming a trench in the substrate 1402.

A first insulating layer 1406 can be deposited, followed by a first lead layer 1408. The first insulating layer can be, for example, a nitride or oxide material and the conducting layer can be, for example, Au, $TiSi_2$, AuGe. Then, with reference to FIG. 15, another mask 1502 can be formed leaving a portion of the lead 1408 and insulation layer 1406 uncovered. Another material removal process such as etching can be performed to remove portions of the lead and insulation layer 1408, 1406 that are not covered by the mask 1502. Then, with reference to FIG. 16, a layer 1602 of semiconductor material such as Si, InAs, GaAs or InSb is deposited to form a first layer of a magnetically active layer such as the layer 502 described above with reference to FIG. 5.

Figure 17:
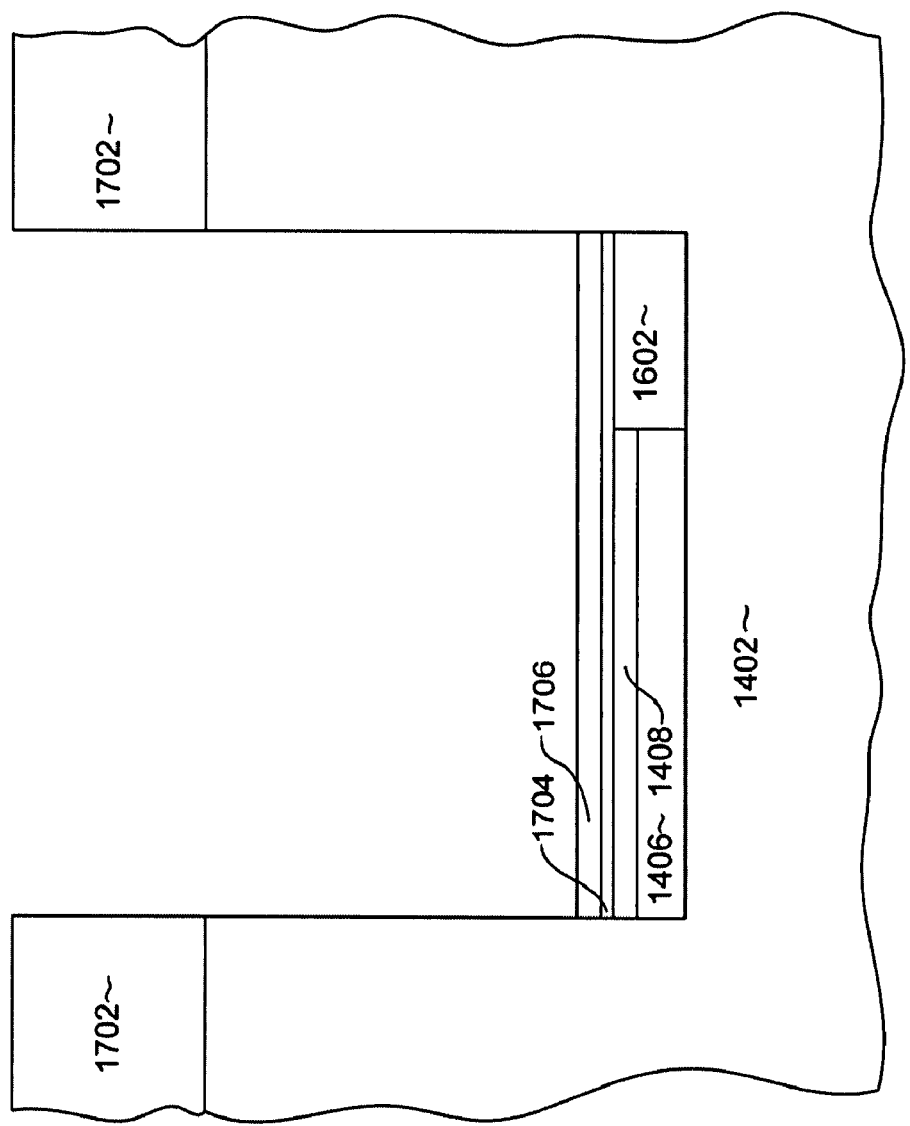
Figure 18:
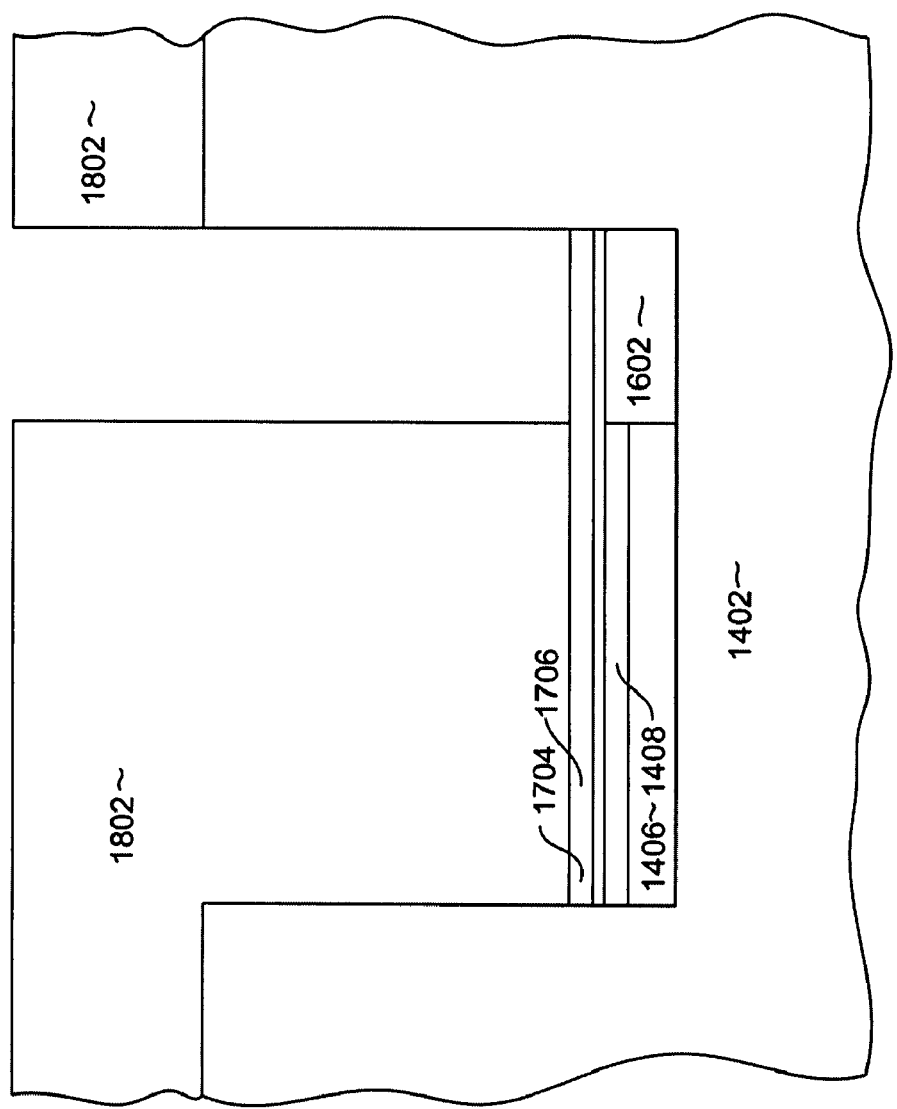
Figure 19:
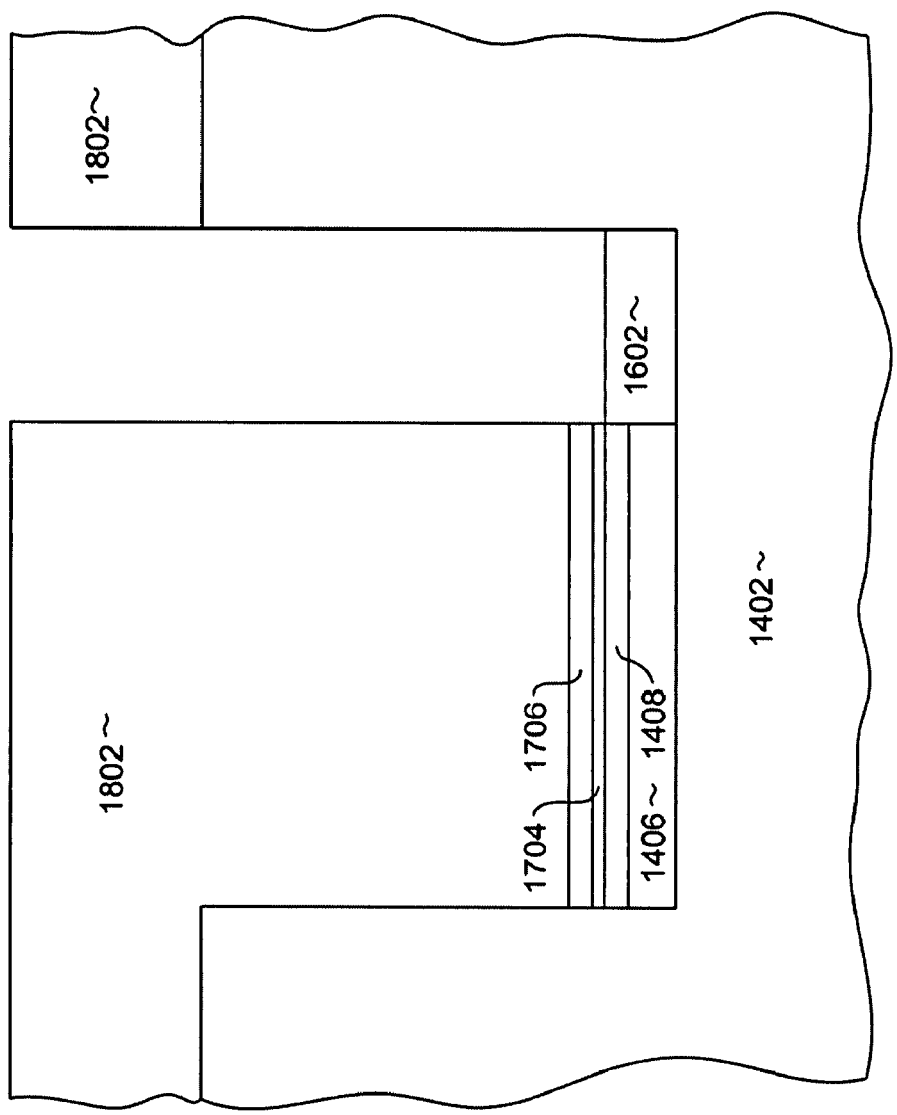
Figure 20:
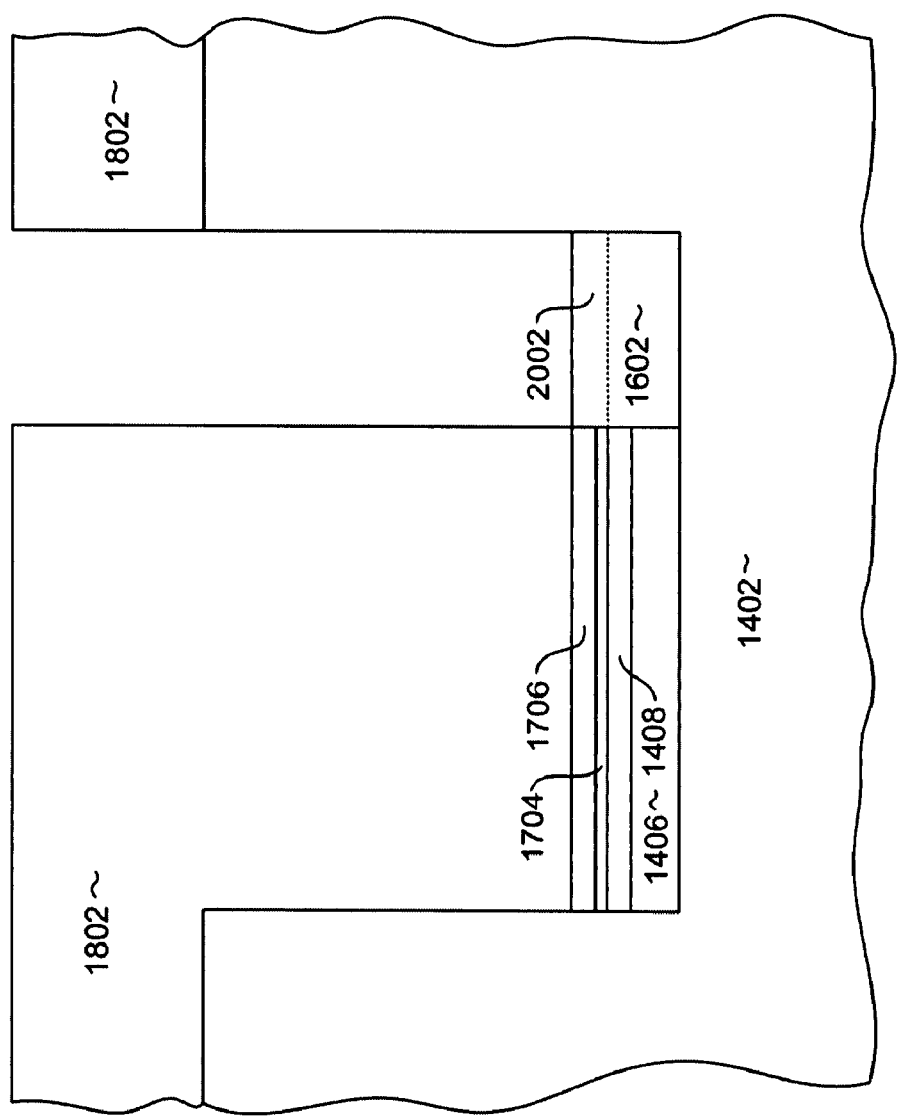

Then, with reference to FIG. 17, another mask 1702 is formed having a structure similar to the mask 1404 described with reference to FIG. 14, and an insulation layer 1704 and lead layer 1706 are deposited. Again the lead layer 1706 can be polysilicon, Au, $TiSi_2$, AuGe and the insulation layer 1704 can be a nitride or oxide. Then, with reference to FIG. 18 another mask 1802 is formed similar to the mask 1502 described with reference to FIG. 15, and then a mild etching process can be performed to remove the portions of the layers 1704, 1706 that are not covered by the mask 1802, resulting in a structure as shown in FIG. 19. Then, with reference to FIG. 20, another layer of semiconductor 2002 such as Si, InAs, GaAs or InSb can be deposited.

Figure 21:
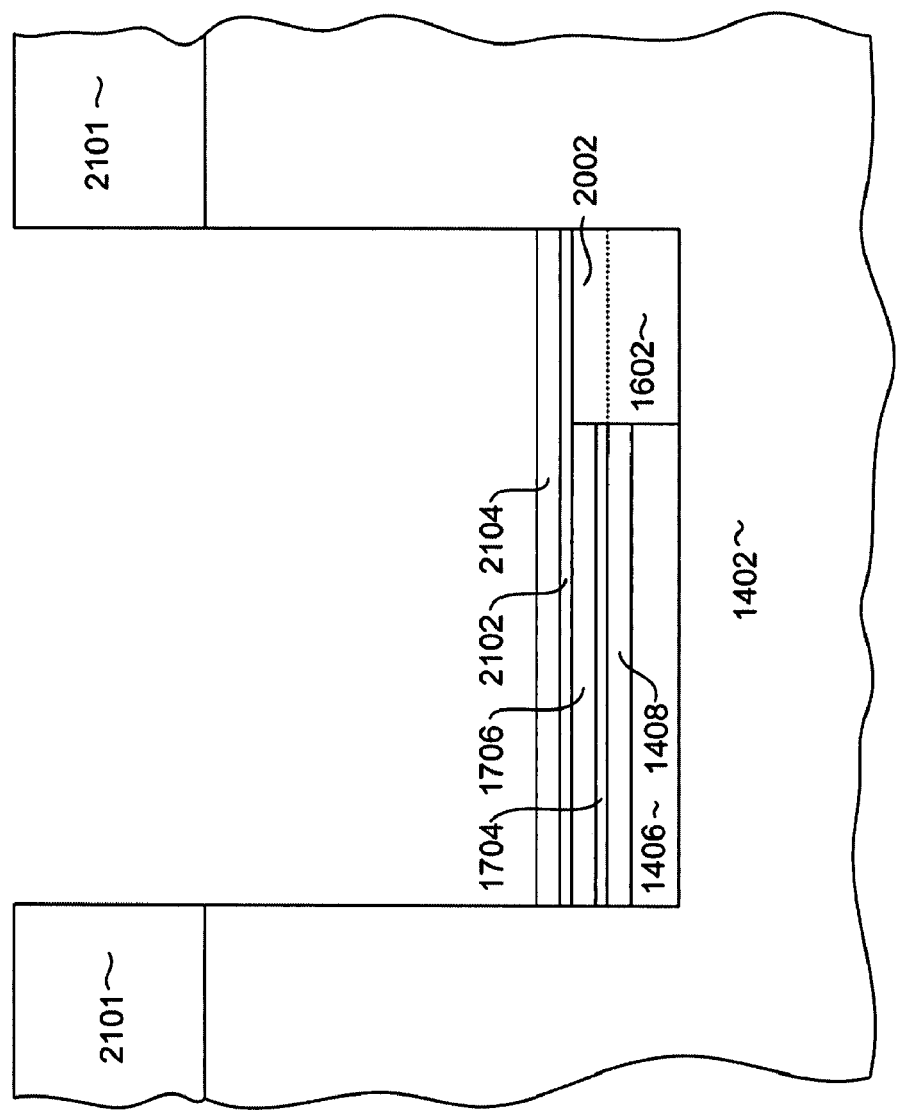
Figure 22:
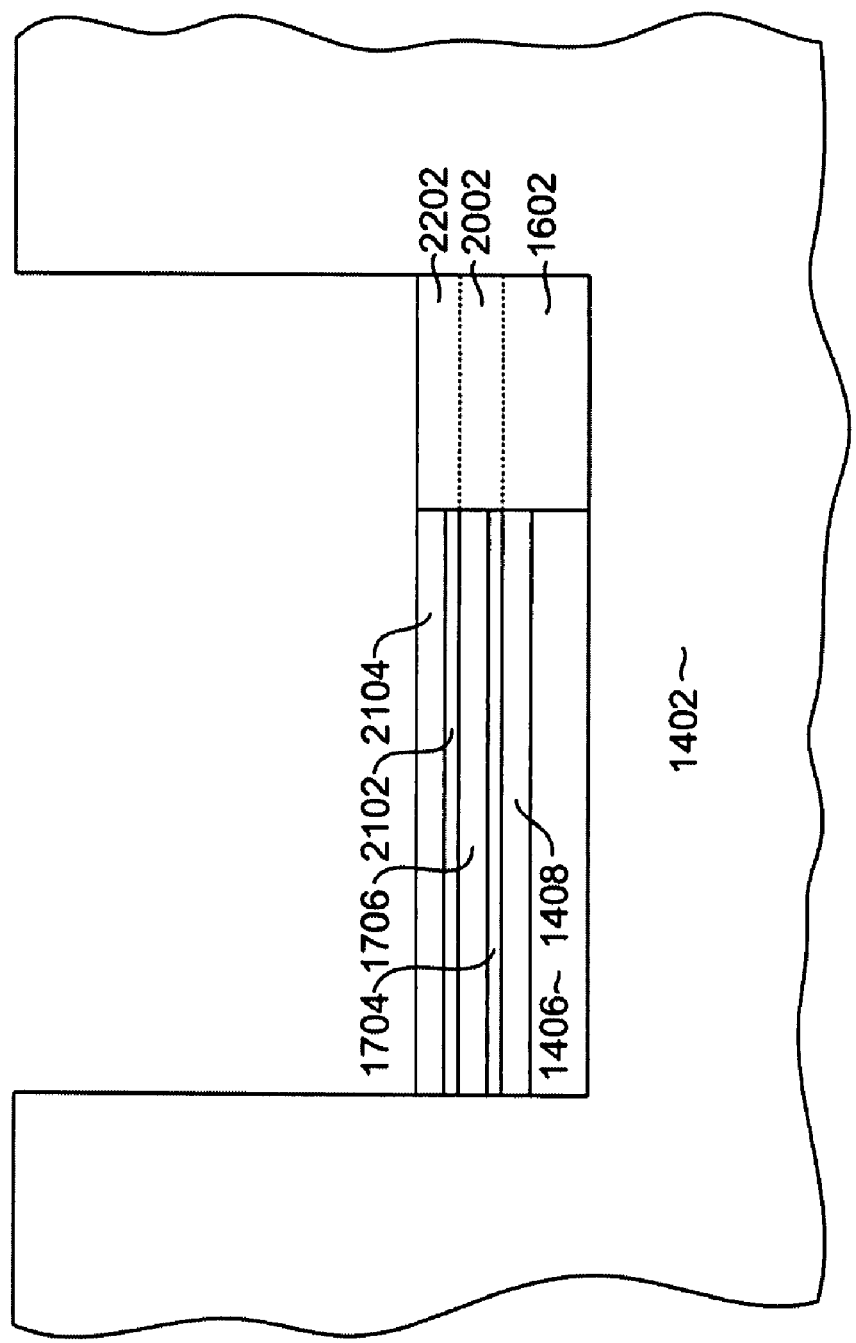
Figure 23:
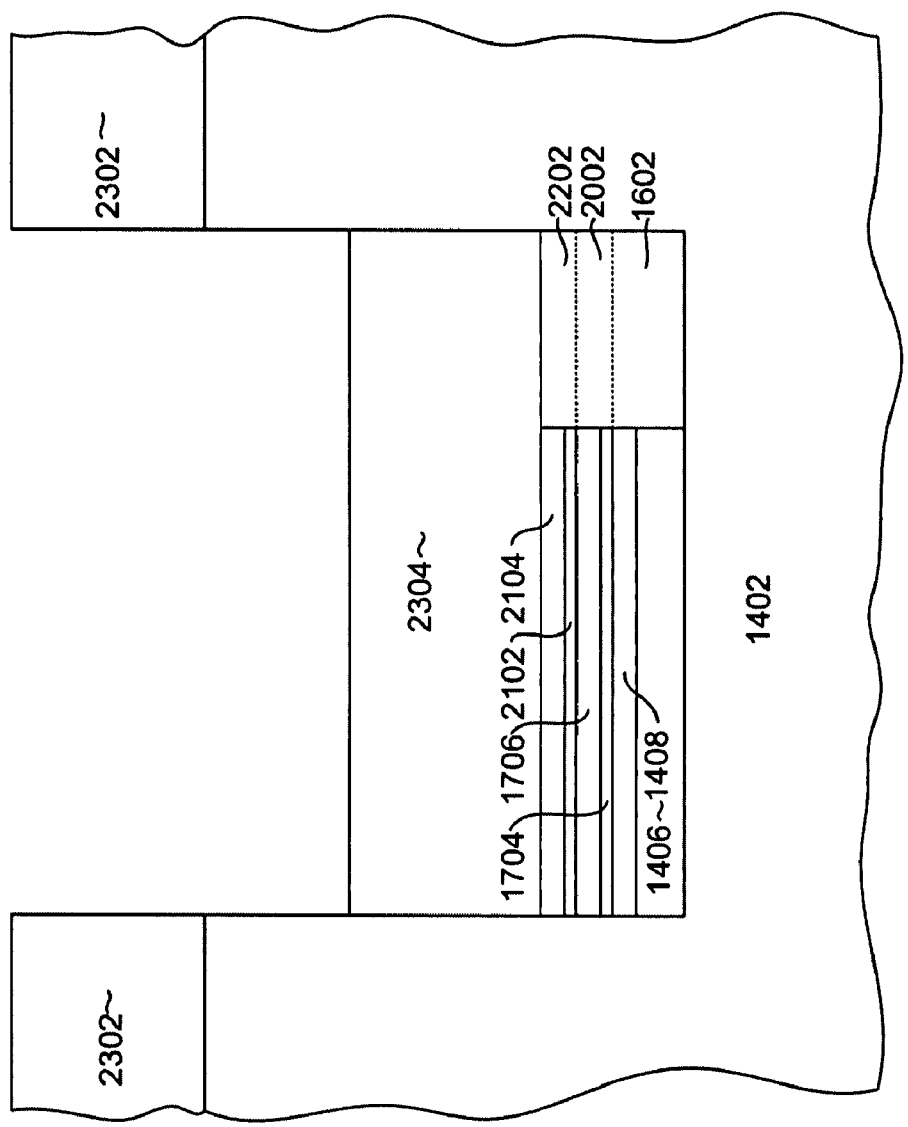
Figure 24:
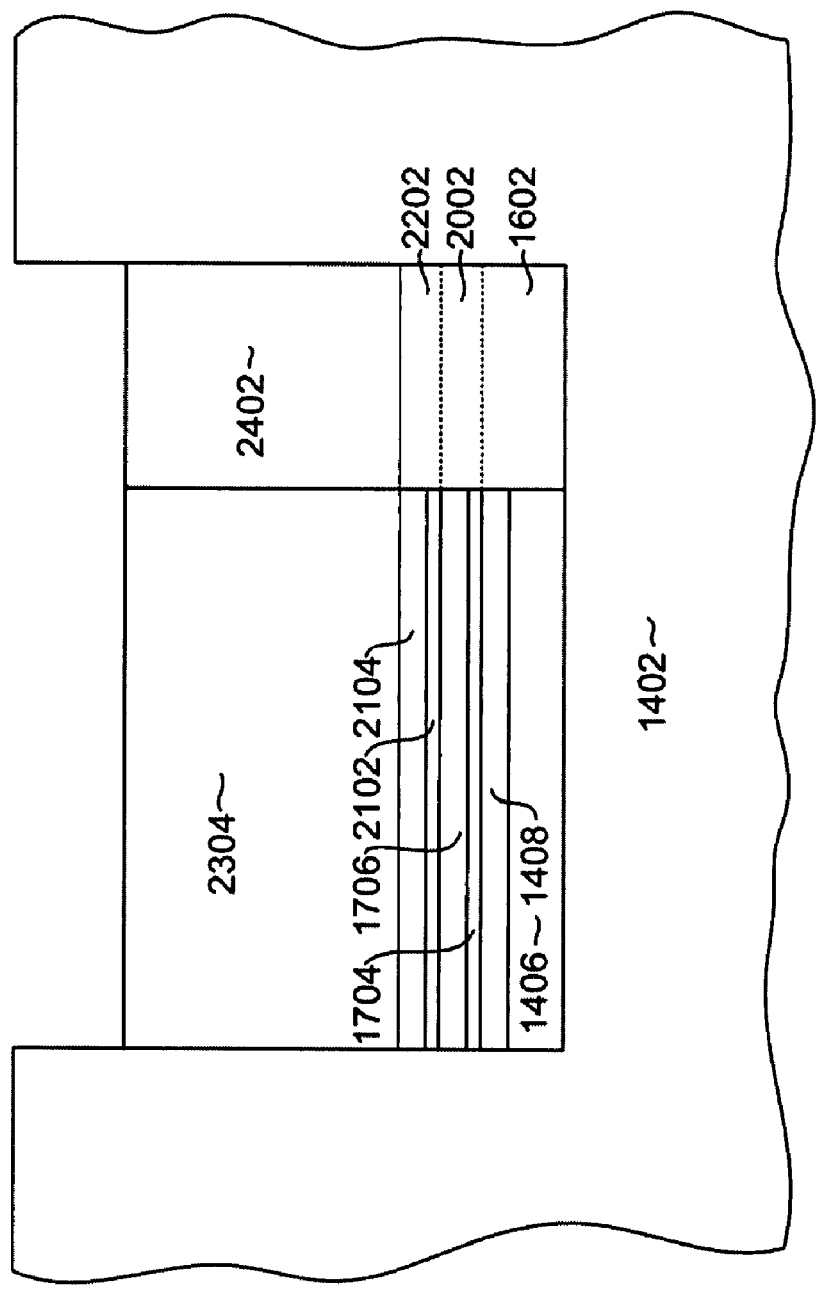
Figure 25:
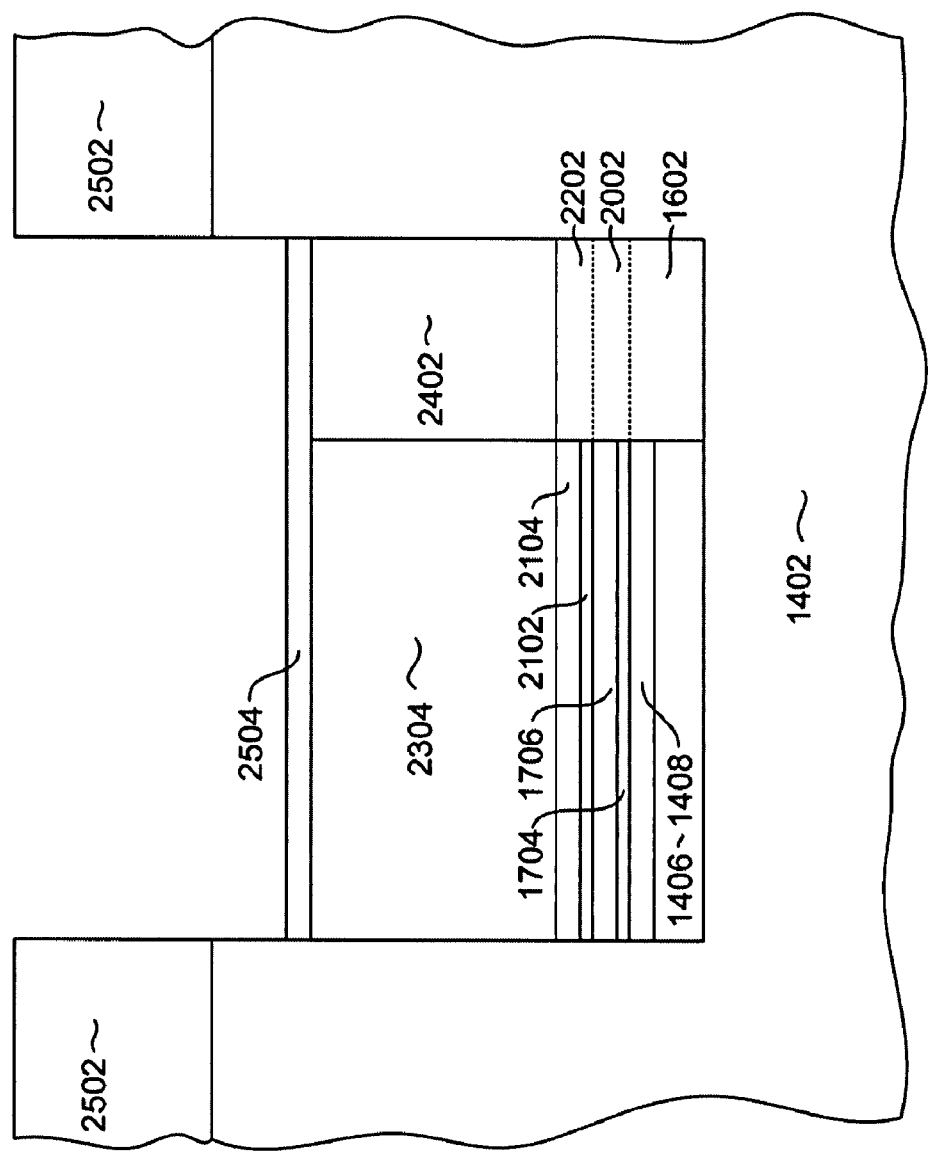
Figure 26:
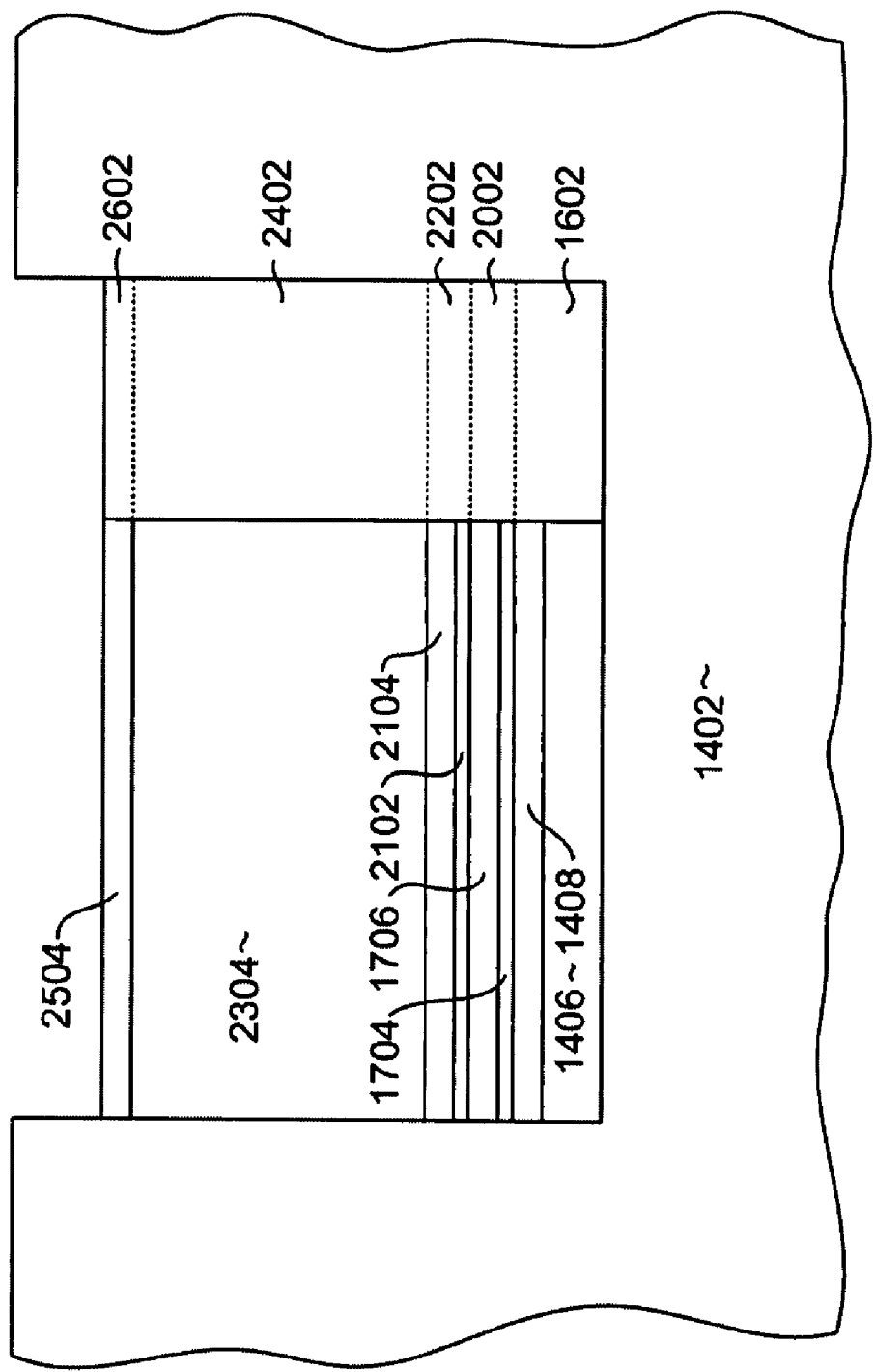

This process is repeated several more times. With reference to FIG. 21, another mask 2101. is formed similar to the mask 1702 (FIG. 17), and insulation and lead layers 2102, 2104 are deposited. Again, the insulation layer can be a nitride or oxide and the lead layer can be a material such as polysilicon, Au, $TiSi_2$, AuGe. Then, with reference to FIG. 22, another masking, etching and deposition step is performed, as described above, to deposit another layer of semiconductor 2202 as shown in FIG. 22. Then, with reference to FIG. 23, another mask 2302 is formed and a thicker layer of insulating material 2304 such as nitride or oxide is deposited, and with reference to FIG. 24, another masking etching and deposition process is performed to deposit another, thicker layer of semiconductor 2402 adjacent to the insulation layer 2304. Then, with reference to FIG. 25, another mask 2502 is formed and another lead layer 2504 such as polysilicon, Au, $TiSi_2$, AuGe is deposited. Then, with reference to FIG. 26, another masking, etching, and deposition process is performed to deposit another layer of semiconductor adjacent to the lead layer 2504.

Figure 27:
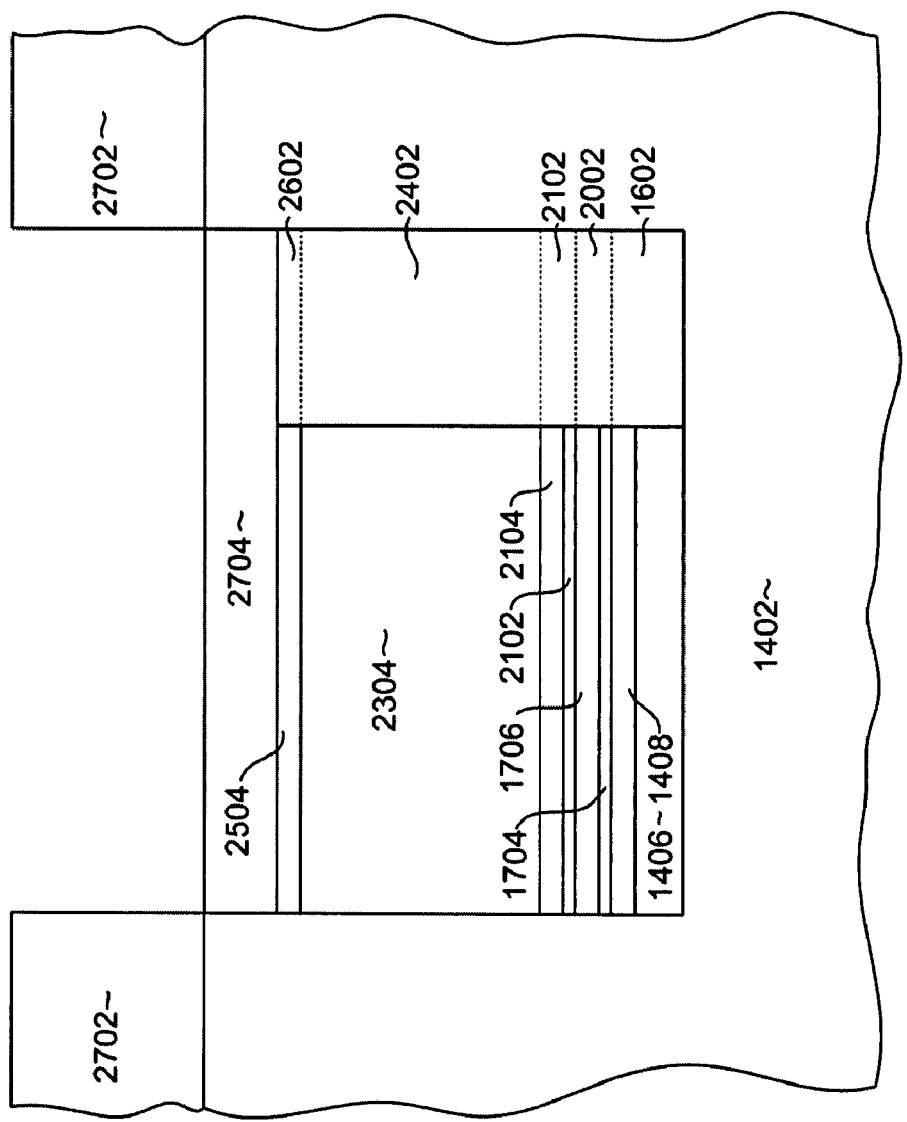
Figure 28:
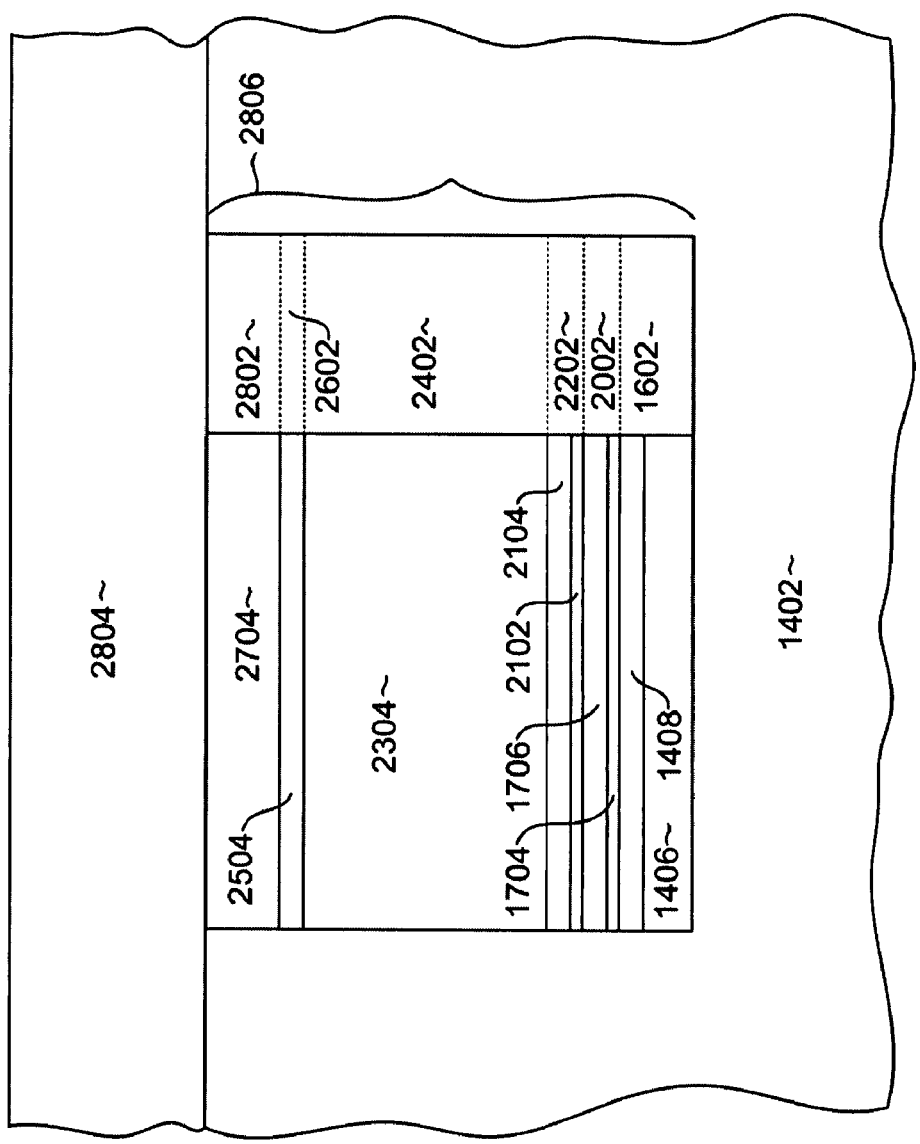

Then, with reference to FIG. 27, another mask 2702 is formed and another last layer of insulating material 2704 is deposited and as shown in a FIG. 28, another masking, etching, and deposition step is performed to form another, last layer of semiconductor material 2802 adjacent to the insulation layer 2704. A protective layer 2804 of non-magnetic, electrically insulating material can be deposited to protect the sensor structure just created from damage. The deposited semiconductor layers 1602, 2002, 2202, 2402, 2602, 2802 together form a magnetically active semiconductor structure that corresponds with the structure 502 described above with reference to FIG. 5.

The above described series of deposition and etching steps, allows the semiconductor layers 1602, 2002, 2202, 2402, 2602, 2802 to be deposited adjacent to the lead and insulation layers 1406, 1408, 1704, 1706, 2102, 2104, 2304, 2504, 2704, using a series of gentle etching steps, rather than a single severe etching step, thereby avoiding damage to the layers that might otherwise result from a single severe etching step. After forming the structure as described above, the wafer on which the entire structure has been formed can be sliced and lapped so that surface as viewed in FIG. 28 is exposed and forms an Air Bearing Surface (ABS).

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A Lorentz magnetoresistive sensor, comprising:
   a magnetically active structure having first and second sides and having an air bearing surface, the magnetically active structure comprising a quantum well formed in a semiconductor heterostructure;
   a plurality of electrically conductive leads, electrically connected with the second side of the magnetically active structure, each of the electrically conductive leads comprising a layer of electrically conductive material formed along a plane oriented perpendicular to the air bearing surface.

2. A sensor as in claim 1 having electrically insulating layers formed adjacent to each of the plurality of electrically conductive lead layers, the electrically insulating layers being formed along a plane perpendicular to the air bearing surface.

3. A sensor as in claim 2 wherein the electrically insulating layer comprises an oxide.

4. A sensor as in claim 2 wherein the electrically insulating layer comprises a nitride.

5. A sensor as in claim 1 wherein each of the electrically conductive leads comprises a material selected from the group consisting of: polysilicon, Au, $TiSi_2$, and AuGe.

6. A sensor as in claim 1 wherein the magnetically active layer comprises a semiconductor.

7. A sensor as in claim 1 wherein the magnetically active layer comprises a material selected from the group consisting of Si, GaAs, InAs, InSb or an alloy of In, As and Sb.

8. A Lorentz magnetoresistive sensor, comprising:
a magnetically active structure having first and second sides and having an air bearing surface extending between the first and second sides;
an electrically conductive shunt structure electrically connected with the first side of the magnetically active layer; and
a plurality of electrically conductive leads, electrically connected with the second side of the magnetically active structure, each of the electrically conductive leads comprising a layer of electrically conductive material formed along a plane oriented perpendicular to the air bearing surface.

9. A Hall magnetoresistive sensor, comprising:
a magnetically active structure having first and second sides and having an air bearing surface extending between the first and second sides, the magnetically active structure comprising a quantum well formed in a semiconductor heterostructure;
a plurality of electrically conductive leads, electrically connected with the second side of the magnetically active structure, each of the electrically conductive leads comprising a layer of electrically conductive material formed along a plane oriented perpendicular to the air bearing surface.

10. A Lorentz magnetoresistive sensor, comprising:
a magnetically active structure having an electrical resistance that varies in response to an applied magnetic field;
a plurality of electrically conductive lead layers connected with the magnetically active structure; and
a plurality of electrically insulating layers, each of the electrically conductive lead layers being separated from an adjacent electrically conductive lead layer by one of the plurality of electrically insulating layers; and wherein
the spacing between the electrically conductive leads is determined by the thickness of the electrically insulating layer;
wherein each of the electrically conductive lead layers comprises a layer of polysilicon formed alone a plane that is perpendicular to an air bearing surface of the EMR sensor.

11. A Lorentz magnetoresistive sensor as in claim 10 wherein each of the electrically conductive leads has a lead width that is defined by a thickness of that electrically conductive lead layer.

12. A Lorentz magnetoresistive sensor as in claim 10 wherein each of the electrically conductive lead layers comprises a layer of electrically conductive material formed along a plane that is perpendicular to an air bearing surface of the EMR sensor.

13. A Lorentz magnetoresistive sensor as in claim 10 wherein each of the electrically insulating layers comprises a layer of electrically insulating material formed along a plane that is perpendicular to an air bearing surface of the sensor.

14. A Lorentz magnetoresisive sensor as in claim 10 wherein each of the electrically insulating layers comprises a layer of oxide formed along a plane that is perpendicular to an air bearing surface of the sensor.

15. A Lorentz magnetoresistive sensor as in claim 10 wherein each of the electrically insulating layers comprises a layer of nitride formed along a plane that is perpendicular to an air bearing surface of the sensor.

* * * * *

UNITED STATES PATENT AND TRADEMARK OFFICE
CERTIFICATE OF CORRECTION

| | | |
|---|---|---|
| PATENT NO. | : 8,125,742 B2 | Page 1 of 1 |
| APPLICATION NO. | : 11/857393 | |
| DATED | : February 28, 2012 | |
| INVENTOR(S) | : Bruce Alvin Gurney et al. | |

It is certified that error appears in the above-identified patent and that said Letters Patent is hereby corrected as shown below:

In the Specification:

Column 12, line 10 replace "formed alone a plane" with --formed along a plane--.

Signed and Sealed this
Fourteenth Day of July, 2015

Michelle K. Lee
*Director of the United States Patent and Trademark Office*